US011631641B2

(12) United States Patent
Nakayama et al.

(10) Patent No.: US 11,631,641 B2
(45) Date of Patent: Apr. 18, 2023

(54) SEMICONDUCTOR DEVICE, SEMICONDUCTOR MODULE, AND VEHICLE

(71) Applicant: FUJI ELECTRIC CO., LTD., Kanagawa (JP)

(72) Inventors: Tomoya Nakayama, Matsumoto (JP); Akihiro Osawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/033,923

(22) Filed: Sep. 28, 2020

(65) Prior Publication Data

US 2021/0013141 A1    Jan. 14, 2021

Related U.S. Application Data

(63) Continuation of application No. PCT/JP2019/036307, filed on Sep. 17, 2019.

(30) Foreign Application Priority Data

Oct. 5, 2018    (JP) .............................. JP2018-189632

(51) Int. Cl.
*H01L 23/528*    (2006.01)
*H01L 23/46*    (2006.01)
(Continued)

(52) U.S. Cl.
CPC .......... *H01L 23/528* (2013.01); *H01L 23/053* (2013.01); *H01L 23/46* (2013.01);
(Continued)

(58) Field of Classification Search
CPC ..... H01L 23/528; H01L 23/053; H01L 23/46; H01L 23/473; H01L 23/5386;
(Continued)

(56) References Cited

U.S. PATENT DOCUMENTS 5,616,955 A    4/1997 Yamada
5,705,848 A    1/1998 Bayerer
(Continued)

FOREIGN PATENT DOCUMENTS

EP    2824703 A1    1/2015
JP    2005251905 A    9/2005
(Continued)

OTHER PUBLICATIONS

International Search Report and (ISA/237) Written Opinion of the International Search Authority for International Patent Application No. PCT/JP2019/036307, mailed by the Japan Patent Office dated Nov. 26, 2019.
(Continued)

*Primary Examiner* — Andres Munoz

(57) ABSTRACT

Provided is a semiconductor device including: a circuit board; a wiring pattern; a first semiconductor chip and a second semiconductor chip; a first lead frame; and a second lead frame; wherein the first lead frame and the second lead frame each comprises: a chip joining portion provided above at least a part of the semiconductor chip; a wiring joining portion provided above at least a part of the wiring pattern; and a bridging portion for connecting the chip joining portion and the wiring joining portion; and in the first direction, a space between the bridging portion of the first lead frame and the bridging portion of the second lead frame is smaller than a space between the chip joining portion of the first lead frame and the chip joining portion of the second lead frame.

15 Claims, 14 Drawing Sheets

(51) Int. Cl.
*H01L 23/053* (2006.01)
*H01L 23/473* (2006.01)
*H01L 23/538* (2006.01)
*H01L 25/07* (2006.01)
*H01L 23/00* (2006.01)

(52) U.S. Cl.
CPC ........ *H01L 23/473* (2013.01); *H01L 23/5386* (2013.01); *H01L 24/37* (2013.01); *H01L 24/40* (2013.01); *H01L 25/072* (2013.01)

(58) Field of Classification Search
CPC ................ H01L 23/24; H01L 23/3735; H01L 23/49811; H01L 23/645; H01L 24/37; H01L 24/40; H01L 25/072
See application file for complete search history.

(56) References Cited

U.S. PATENT DOCUMENTS

| | | | |
|---|---|---|---|
| 7,253,507 B2* | 8/2007 | Kouzuki | H01L 24/37 257/678 |
| 9,006,881 B2* | 4/2015 | Fukuyoshi | H01L 23/24 257/712 |
| 9,312,234 B2* | 4/2016 | Sunaga | H01L 24/83 |
| 9,397,030 B2* | 7/2016 | Sunaga | H01L 25/072 |
| 9,402,311 B2* | 7/2016 | Sunaga | H01L 25/07 |
| 9,502,329 B2* | 11/2016 | Nagaune | H01L 23/473 |
| 9,591,755 B2* | 3/2017 | Spang | H05K 1/111 |
| 9,607,931 B2* | 3/2017 | Yasuda | H01L 24/40 |
| 9,633,967 B2* | 4/2017 | Sunaga | H01L 24/40 |
| 9,899,328 B2* | 2/2018 | Tamada | H01L 23/645 |
| 9,905,494 B2* | 2/2018 | Soyano | H01L 23/15 |
| 10,192,811 B2 | 1/2019 | Fukase | |
| 10,373,919 B2 | 8/2019 | Asai | |
| 10,396,056 B2 | 8/2019 | Soyano | |
| 10,461,012 B2 | 10/2019 | Morozumi | |
| 10,847,441 B2* | 11/2020 | Asai | H05K 7/20872 |
| 10,978,366 B2* | 4/2021 | Fujino | H01L 23/49531 |
| 2003/0030481 A1 | 2/2003 | Oumaru | |
| 2005/0194638 A1 | 9/2005 | Kouzuki | |
| 2010/0148298 A1 | 6/2010 | Takano | |
| 2010/0172091 A1 | 7/2010 | Nishiura | |
| 2014/0054762 A1 | 2/2014 | Nagaune | |
| 2014/0284786 A1 | 9/2014 | Fukuyoshi | |
| 2015/0076570 A1* | 3/2015 | Sunaga | H01L 25/072 257/288 |
| 2015/0235923 A1 | 8/2015 | Yasuda | |
| 2015/0237727 A1 | 8/2015 | Spang | |
| 2015/0270199 A1* | 9/2015 | Sunaga | H01L 23/49524 257/288 |
| 2015/0289369 A1 | 10/2015 | Sunaga | |
| 2016/0181221 A1* | 6/2016 | Sunaga | H01L 23/492 257/139 |
| 2016/0190033 A1* | 6/2016 | Morozumi | H01L 23/49838 257/712 |
| 2016/0351505 A1 | 12/2016 | Tamada | |
| 2017/0006721 A1* | 1/2017 | Soyano | H01L 25/072 |
| 2017/0213777 A1 | 7/2017 | Soyano | |
| 2017/0221853 A1 | 8/2017 | Yoneyama | |
| 2017/0287819 A1* | 10/2017 | Fukase | H01L 23/49524 |
| 2018/0076149 A1* | 3/2018 | Asai | H01L 23/3121 |
| 2018/0182692 A1 | 6/2018 | Danno | |
| 2019/0393133 A1 | 12/2019 | Asai | |
| 2020/0083129 A1* | 3/2020 | Fujino | H01L 24/40 |
| 2021/0013141 A1* | 1/2021 | Nakayama | H01L 23/5386 |
| 2021/0225724 A1 | 7/2021 | Satou | |

FOREIGN PATENT DOCUMENTS

| | | |
|---|---|---|
| JP | 2006202885 A | 8/2006 |
| JP | 2009177038 A | 8/2009 |
| JP | 2012212713 A | 11/2012 |
| JP | 2012244040 A | 12/2012 |
| JP | 2014056920 A | 3/2014 |
| JP | 2014187264 A | 10/2014 |
| JP | 2015018946 A | 1/2015 |
| JP | 2015043645 A | 3/2015 |
| JP | 2015099843 A | 5/2015 |
| JP | 2015154079 A | 8/2015 |
| JP | 2015216409 A | 12/2015 |
| JP | 2017017195 A | 1/2017 |
| JP | 2017092056 A | 5/2017 |
| JP | 2017188517 A | 10/2017 |
| JP | 2018032684 A | 3/2018 |
| JP | 2018046164 A | 3/2018 |
| WO | 2015121899 A1 | 8/2015 |
| WO | 2015141284 A1 | 9/2015 |
| WO | 2014068935 A1 | 9/2016 |
| WO | 2016174899 A1 | 11/2016 |
| WO | 2017188368 A1 | 11/2017 |
| WO | 2018168088 A1 | 9/2018 |

OTHER PUBLICATIONS

Extended European Search Report for European Patent Application No. 19868884.8, issued by the European Patent Office dated Oct. 19, 2021.
Partial Supplementary European Search Report for European Patent Application No. 19868884.8, issued by the European Patent Office dated Jun. 15, 2021.

* cited by examiner

SEMICONDUCTOR DEVICE, SEMICONDUCTOR MODULE, AND VEHICLE

The contents of the following Japanese patent applications are incorporated herein by reference:
NO. 2018-189632 filed in JP on Oct. 5, 2018, and
NO. PCT/JP2019/036307 filed on Sep. 17, 2019.

BACKGROUND

1. Technical Field

The present invention relates to a semiconductor device, a semiconductor module, and a vehicle.

2. Related Art

In a semiconductor module including a semiconductor element such as a power semiconductor chip, a configuration providing a lead frame has been known (for example, refer to Patent Literature 1-4).

[Patent Literature 1] International Publication WO 2015/141284
[Patent Literature 2] Japanese Unexamined Patent Application Publication No. 2017-92056
[Patent Literature 3] International Publication WO 2016/174899
[Patent Literature 4] Japanese Unexamined Patent Application Publication No. 2015-99843

Technical Problem

Preferably, a semiconductor device has improved radiation performance.

General Disclosure

In a first aspect of the present invention, a semiconductor device is provided.

The semiconductor device includes: a circuit board; wiring patterns provided above the circuit board; first semiconductor chips and second semiconductor chips that are provided above the circuit board and that are provided along a first direction predefined in a plane parallel to a board surface of the circuit board; first lead frames electrically connecting the first semiconductor chips and the wiring patterns; and second lead frames electrically connecting the second semiconductor chips and the wiring patterns. The first lead frames and the second lead frames each has: a chip joining portion provided above at least a part of the semiconductor chip; a wiring joining portion provided above at least a part of the wiring pattern; and a bridging portion for connecting the chip joining portion and the wiring joining portion. In a first direction, the space between the bridging portion of the first lead frame and the bridging portion of the second lead frame is smaller than the space between the chip joining portion of the first lead frame and the chip joining portion of the second lead frame.

In the first direction, the space between the wiring joining portion of the first lead frame and the wiring joining portion of the second lead frame may be smaller than the space between the chip joining portion of the first lead frame and the chip joining portion of the second lead frame.

A barycentric position of the first semiconductor chip may be consistent with a barycentric position of the chip joining portion in the first lead frame. A barycentric position of the second semiconductor chip may be consistent with a barycentric position of the chip joining portion in the second lead frame.

In a top view, at least one corner of the bridging portion may be provided in a curved shape.

In the bridging portion, an opening may be provided which passes through from the upper surface to the lower surface of the bridging portion.

In a second aspect of the present invention, a semiconductor module is provided. The semiconductor module includes a terminal casing that houses semiconductor devices and a cooling portion that is arranged below the terminal casing. The cooling portion has a top plate with a lower surface and a casing portion. The casing portion includes a coolant flowing portion through which coolant flows and an outer edge portion that surrounds the coolant flowing portion. The coolant flowing portion is arranged on the lower surface side of the top plate, and is arranged at the outer edge portion so as to directly or indirectly adhere to the lower surface of the top plate. The casing portion is arranged on the coolant flowing portion, and includes cooling fins provided in a predefined region with the cooling fins overlapping with at least a part of the semiconductor device in a top view. In the flowing path direction of the coolant, the center of the cooling fins is arranged on the downstream side of the flowing path of the coolant, compared to the center of the coolant flowing portion.

Wiring patterns may include first wiring patterns in which a first direction is defined as the longitudinal direction, and second wiring patterns in which a second direction perpendicular to the first direction in a plane parallel to a board surface of a circuit board is defined as the longitudinal direction. In a top view, the entire first wiring patterns and the second wiring patterns may be arranged to overlap with the cooling fins.

The cooling fins may extend in the first direction, and be provided side-by-side in the second direction.

The semiconductor device may further include output terminals provided on the circuit board, which are electrically connected to the wiring patterns and from which current flowing through the wiring patterns is outputted. The output terminals may be arranged on the downstream side of the flowing path of the coolant.

In a third aspect of the present invention, a vehicle is provided. The vehicle includes a semiconductor module.

The summary clause does not necessarily describe all necessary features of the embodiments of the present invention. The present invention may also be a sub-combination of the features described above.

DESCRIPTION OF EXEMPLARY EMBODIMENTS

The following describes the present invention through embodiments of the invention, but the following embodiments do not limit the invention according to the claims. In addition, not all the combinations of features described in the embodiment are necessarily required in solutions of the invention.

In the specification, one side in a direction parallel to the depth direction of a top plate is referred to as "top", and another side is referred to as "bottom". Of two main surfaces of a substrate, a layer, or the other members, one surface is referred to as the upper surface and another surface is referred to as the lower surface. A direction of "top" or "bottom" is not limited to a gravitational direction or a direction in which a semiconductor chip is mounted on a substrate or the like during its implementation.

In the specification, technical matters may be described by using orthogonal coordinate axes of the X axis, Y axis, and Z axis. In the specification, a plane parallel to the upper surface of the top plate is defined as the XY plane, and the depth direction perpendicular to the upper surface of the top plate is defined as the Z axis. A top view means a case that the upper surface of the semiconductor module is seen from the positive side of the Z axis.

Figure 1:
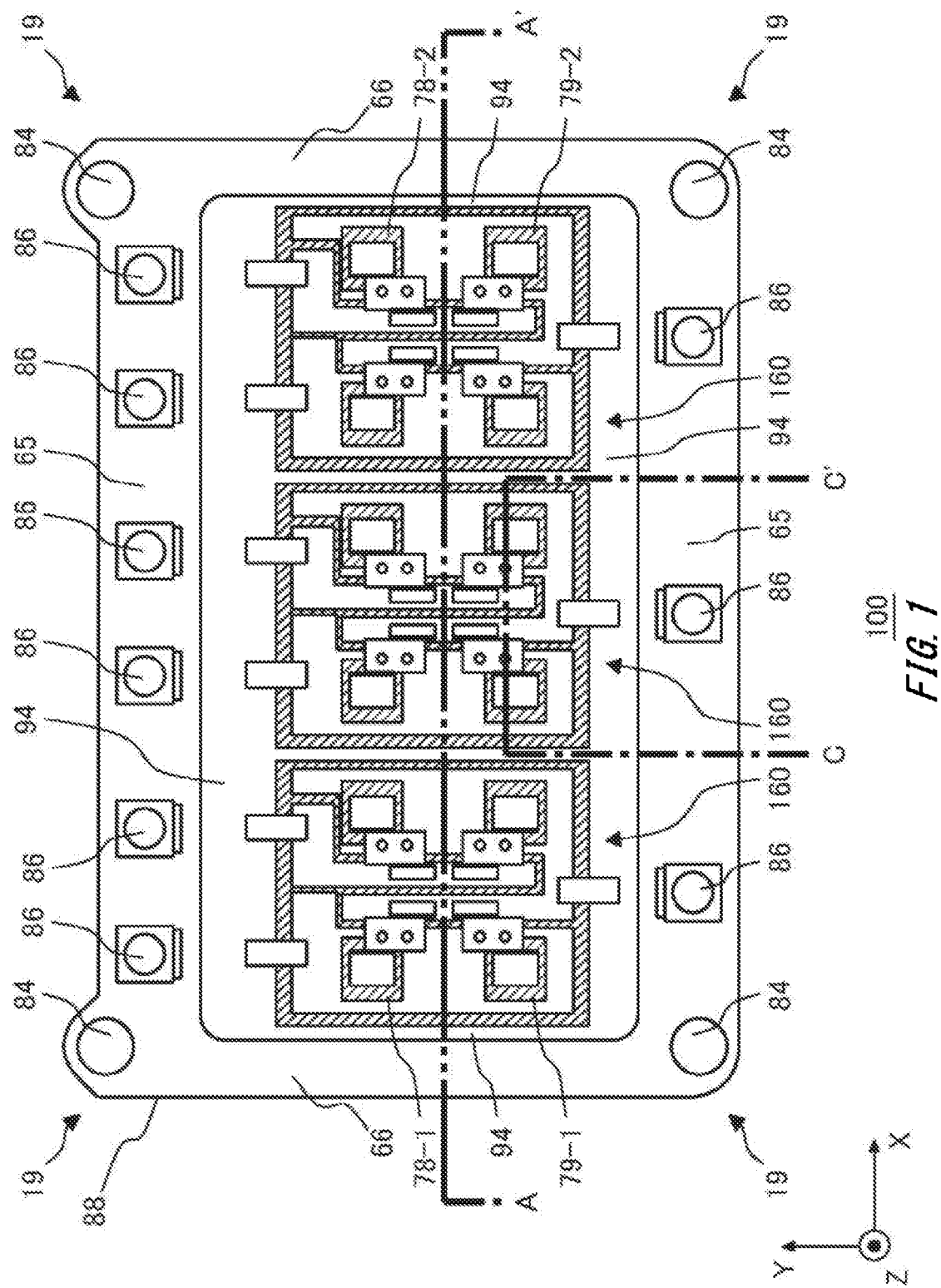
FIG. 1 is a diagram illustrating an example of the upper surface of a semiconductor module 100 according to one embodiment of the present invention.

FIG. 1 is a diagram illustrating an example of the upper surface of a semiconductor module 100 according to one embodiment of the present invention. In the specification, in a terminal casing 88 in a rectangular shape in a top view in FIG. 1, the longer direction is defined as the X axis and the shorter direction is defined as the Y axis.

The semiconductor module 100 in this example includes the terminal casing 88 made of resin, which houses first semiconductor chips 78 and second semiconductor chips 79 such as power semiconductors. An example of the power semiconductor includes an insulated gate bipolar transistor (IGBT), a diode such as an FWD (Free Wheel Diode), and an RC (Reverse Conducting)-IGBT combining thereof, and a MOS transistor, etc. The first semiconductor chips 78 and the second semiconductor chips 79 may be formed by using a semiconductor substrate made of silicon carbide, gallium nitride, or the like, in addition to silicon.

In this example, the terminal casing 88 is molded by using resin such as thermosetting resin formable in injection molding or ultraviolet-curing resin formable in UV molding. Such resin includes one or more polymer materials selected from, for example, polyphenylene sulfide (PPS) resin, poly- butylene terephthalate (PBT) resin, polyamide (PA) resin, acrylonitrile butadiene styrene (ABS) resin, acrylic resin, and the like.

The terminal casing 88 has two side walls 65 parallel to the X axis direction and two side walls 66 parallel to the Y axis direction. The two side walls 65 and the two side walls 66 define a region housing the semiconductor devices 160, and are provided so as to surround the semiconductor devices 160 in a top view. The side walls 65 extending in the X axis direction and the side walls 66 extending in the Y axis direction are crossed at four regions where corner portions 19 are provided.

The semiconductor module 100 in this example has a top plate 94 below the terminal casing 88. The top plate 94 may be a plate-like metallic sheet having a plane parallel to the XY plane. The top plate 94 is formed of a metal material including, for example, aluminum and/or copper. The top plate 94 may be a top plate of a component provided below the terminal casing 88. For example, the top plate 94 is a top plate of a cooling portion that cools the semiconductor module 100.

The top plate 94 is provided to overlap the side walls 65 and the side walls 66 in a top view. In a top view, the upper surface of the top plate 94 is exposed in a rectangular region defined by the two side walls 65 and the two side walls 66. On the exposed upper surface of the top plate 94, the semiconductor devices 160 are placed. The semiconductor devices 160 are fixed on the upper surface of the top plate 94 by a joining material such as solder. In this example, three semiconductor devices 160 are placed on the upper surface of the top plate 94.

The semiconductor device 160 has first semiconductor chips 78 and second semiconductor chips 79 such as power semiconductors. Heat generated by the first semiconductor chips 78 and the second semiconductor chips 79 is transferred to the top plate 94.

The terminal casing 88 has main terminals 86. For example, the main terminals 86 include U-phase terminal(s), V-phase terminal(s), and W-phase terminal(s) for respectively driving the U-phase, the V-phase, and the W-phase in a three-phase inverter circuit. In addition, the main terminal 86 are power source terminals for supplying power source to the three-phase inverter circuit, for example. In addition, the terminal casing 88 may have through-holes 84 for fixing the semiconductor module 100 to an external device. The through-holes 84 may be provided at each of the four corners 19.

Figure 2:
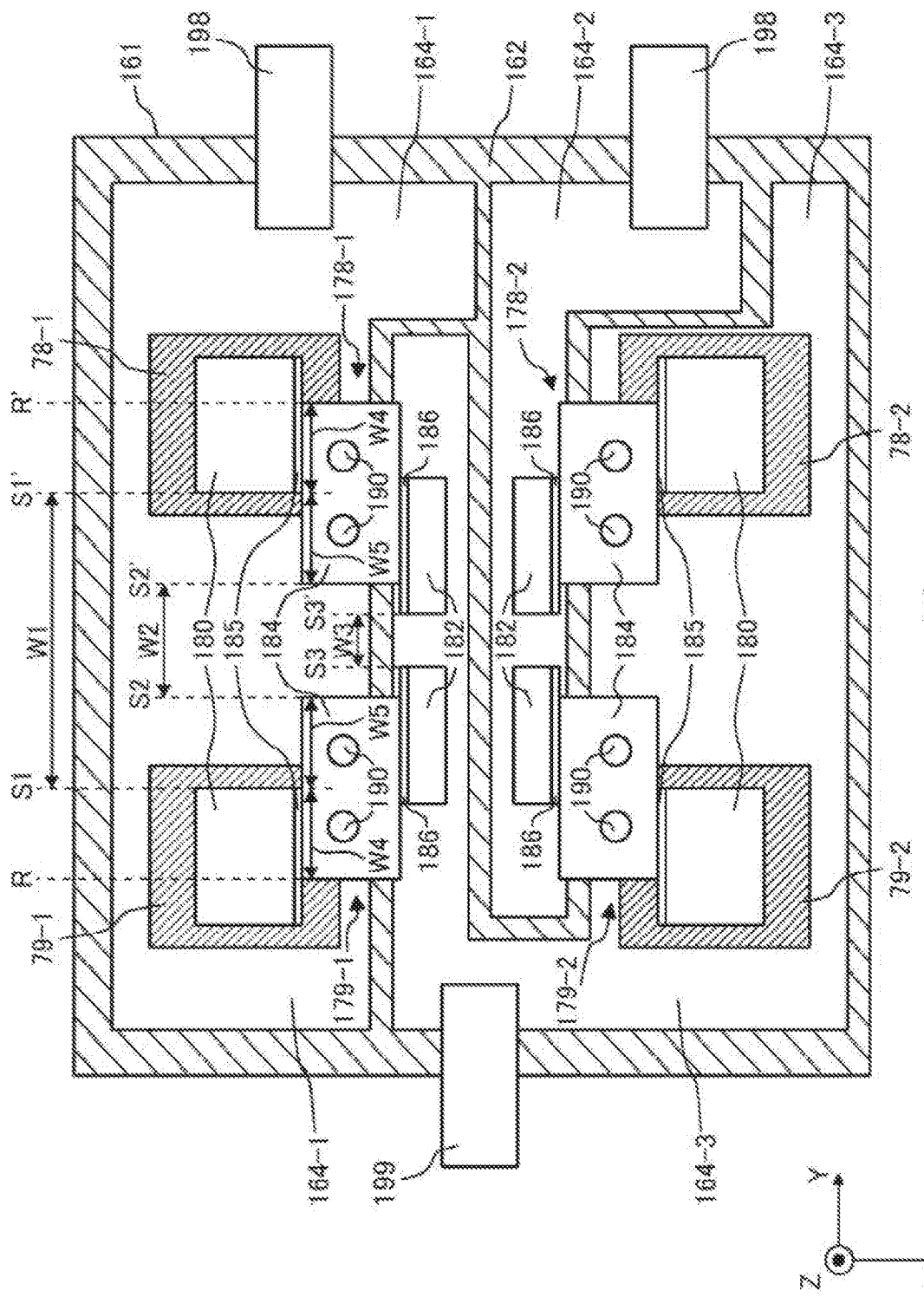
FIG. 2 is an enlarged view of one semiconductor device 160 in FIG. 1.

FIG. 2 is an enlarged view of one semiconductor device 160 in FIG. 1. The semiconductor device 160 has a circuit board 162. The circuit board 162 has an insulating plate 161 and wiring patterns 164. The wiring patterns 164 are provided above the insulating plate 161.

The circuit board 162 may be a DCB (Direct Copper Bonding) board or an AMB (Active Metal Brazing) board, for example. The insulating plate 161 may be formed by using a ceramic material such as alumina ($Al_2O_3$), aluminum nitride (AlN), silicon nitride ($Si_3N_4$). The wiring patterns 164 are thin films formed of a conductive material such as copper or the like, for example.

Above the insulating plate 161, the first semiconductor chips 78 and the second semiconductor chips 79 are provided. The first semiconductor chips 78 and the second semiconductor chips 79 are provided above the wiring patterns 164. The first semiconductor chips 78 and the second semiconductor chips 79 are provided along a first direction (Y axis direction) predefined in a plane (XY plane) parallel to the board surface of the insulating plate 161. The first semiconductor chips 78 and the second semiconductor chips 79 may be connected onto the wiring patterns 164 by solder or the like.

On the circuit board 162, power source terminals 198 and an output terminal 199 are provided. The power source terminals 198 and the output terminal 199 are electrically connected to the wiring patterns 164. The power source terminals 198 may be connected to the power source via the main terminals 86. The output terminal 199 may be connected to a load via the main terminal 86. Each of the power source terminals 198 and the output terminal 199 may be connected to wiring pattern 164 by solder joining or ultrasonic joining.

The first semiconductor chips 78 and the second semiconductor chips 79 may be chips having the same structure. The first semiconductor chips 78 and the second semiconductor chips 79 may be fabricated by using a common process. In this example, the semiconductor chips arranged upstream and downstream of a flowing path direction (described below) of coolant cooling the first semiconductor chips 78 and the second semiconductor chips 79 are referred to as first semiconductor chips 78 and second semiconductor chips 79, respectively.

A first semiconductor chip 78-1 is a semiconductor chip provided on the negative side of the X axis in two first semiconductor chips 78 provided above the insulating plate 161. A first semiconductor chip 78-2 is a semiconductor chip provided on the positive side of the X axis in two first semiconductor chips 78 provided above the insulating plate 161. A second semiconductor chip 79-1 is a semiconductor chip provided on the negative side of the X axis in two second semiconductor chips 79 provided above the insulating plate 161. A second semiconductor chip 79-2 is a semiconductor chip provided on the positive side of the X axis in two second semiconductor chips 79 provided above the insulating plate 161.

Above the first semiconductor chips 78, first lead frames 178 are provided. Above the second semiconductor chips 79, second lead frames 179 are provided. The first lead frames 178 and the second lead frames 179 are formed of metal mainly containing copper or aluminum, for example. On the surfaces of the first lead frames 178 and the second lead frames 179, plating films made of nickel or the like may be formed.

A first lead frame 178-1 is a lead frame provided on the negative side of the X axis in two first lead frames 178 provided above the insulating plate 161. A first lead frame 178-2 is a lead frame provided on the positive side of the X axis in two first lead frames 178 provided above the insulating plate 161. A second lead frame 179-1 is a lead frame provided on the negative side of the X axis in two second lead frames 179 provided above the insulating plate 161. A second lead frame 179-2 is a lead frame provided on the positive side of the X axis in two second lead frames 179 provided above the insulating plate 161.

The first lead frame 178-1 electrically connects the first semiconductor chip 78-1 and the wiring pattern 164-3. The first lead frame 178-2 electrically connects the first semiconductor chip 78-2 and the wiring pattern 164-2. The second lead frame 179-1 electrically connects the second semiconductor chip 79-1 and the wiring pattern 164-3. The second lead frame 179-2 electrically connects the second semiconductor chip 79-2 and the wiring pattern 164-2. Between the first lead frames 178 and the first semiconductor chips 78 and between the first lead frames 178 and the wiring patterns 164 may be connected by solder or the like, respectively. Between the second lead frames 179 and the second semiconductor chips 79 and between second lead frames 179 and wiring patterns 164 may be connected by solder or the like, respectively.

The first lead frames 178 and the second lead frames 179 in this example each has the chip joining portion 180, the wiring joining portion 182, the bridging portion 184, leg portion 185, and leg portion 186. The chip joining portion 180 of the first lead frame 178-1 is arranged above at least a part of the first semiconductor chip 78-1. The chip joining portion 180 of the first lead frame 178-2 is arranged above at least a part of the first semiconductor chip 78-2. The chip joining portion 180 of the second lead frame 179-1 is arranged above at least a part of the second semiconductor chip 79-1. The chip joining portion 180 of the second lead frame 179-2 is arranged above at least a part of the second semiconductor chip 79-2.

That the chip joining portion 180 of the first lead frame 178-1 is arranged above at least a part of the first semiconductor chip 78-1 may include not only the case that the entire chip joining portion 180 is arranged inside of the first semiconductor chip 78-1 in a top view, but also the case that a part of the chip joining portion 180 is arranged inside of the first semiconductor chip 78-1 in a top view and a part of the chip joining portion 180 is arranged outside of the first semiconductor chip 78-1 in a top view. In addition, the case that the entire first semiconductor chip 78-1 is arranged inside of the chip joining portion 180 in a top view may be also included.

The wiring joining portions 182 are arranged above at least parts of the wiring patterns 164. That the wiring joining portions 182 are arranged above at least parts of the wiring patterns 164 may include not only the case that the entire wiring joining portions 182 are arranged inside of the wiring patterns 164 in a top view, but also the case that parts of the wiring joining portions 182 are arranged inside of the wiring patterns 164 in a top view and parts of the wiring joining portions 182 are arranged outside of the wiring patterns 164 in a top view.

The bridging portions 184 bridge between the chip joining portions 180 and the wiring joining portions 182, and connect the both portions. The bridging portions 184 are provided above (on the positive side of the Z axis) the chip joining portions 180 and the wiring joining portions 182. That the bridging portions 184 bridge and connect between the chip joining portions 180 and the wiring joining portions 182 refers to that the bridging portions 184 span, in the air above the wiring patterns 164, the wiring patterns 164 and connect the chip joining portions 180 and the wiring joining portions 182.

The leg portions 185 connect the chip joining portions 180 and the bridging portions 184. The leg portions 186 connect the wiring joining portion 182 and the bridging portion 184.

The chip joining portions 180 and the wiring joining portions 182 and the bridging portions 184 may be plate-like conductive members parallel to the XY plane. The leg portions 185 and the leg portions 186 may be plate-like conductive members parallel to the YZ plane.

The chip joining portions 180, the wiring joining portions 182, the bridging portions 184, the leg portions 185, and the leg portions 186 may be integrally provided. That the chip joining portions 180, the wiring joining portions 182, the bridging portions 184, the leg portions 185, and the leg portions 186 are integrally provided may include not only the case that the chip joining portions 180, the wiring joining portions 182, the bridging portions 184, the leg portions 185, and the leg portions 186 are formed folding one plate-like conductive member, but also the case that the chip joining portions 180, the wiring joining portions 182, the bridging portions 184, the leg portions 185, and the leg portions 186 that each are made of one plate-like conductive member are formed joining each of them.

In the bridging portions 184, openings 190 may be provided. The openings 190 may be provided passing through from the upper surface to the lower surface of the bridging portions 184. Providing the openings 190 in the bridging portions 184 facilitates filling gaps between the bridging portions 184 and the circuit board 162 in the Z axis direction with sealant (described below) for sealing the semiconductor device 160.

A plurality of openings 190 may be provided in one bridging portion 184. In this example, two openings 190 are provided in one bridging portion 184. In addition, the plurality of openings 190 may be provided along any direction in one bridging portion 184. In this example, two openings 190 are provided along the Y axis direction in one bridging portion 184.

In the semiconductor device 160 in this example, one first lead frame 178 is connected to one first semiconductor chip 78 and one second lead frame 179 is connected to one second semiconductor chip 79. Due to that, current caused by operations the first semiconductor chips 78 flows through the first lead frame 178, and current caused by operations of the second semiconductor chips 79 flows through the second lead frames 179. Due to that, the semiconductor device 160 in this example enables a maximum current flowing through each of the first lead frames 178 and the second lead frames 179 to be reduced by avoiding current crowding, compared to the case that the first semiconductor chips 78 and the second semiconductor chips 79 are provided on a common lead frame. This enables the amount of heat generation in each of the first lead frames 178 and the second lead frames 179 to be reduced. In addition, the semiconductor device 160 in this example enables imbalance between the self-inductances of the first lead frames 178 and the self-inductances of the second lead frames 179 to be reduced, compared to the case that the first semiconductor chips 78 and the second semiconductor chips 79 are provided on a common lead frame.

Of two end positions in the Y axis direction of the chip joining portion 180 of the second lead frame 179-1, the end position on the positive side of the Y axis is defined as position S1. Of two end positions in the Y axis direction of the chip joining portion 180 of the first lead frame 178-1, the end position on the negative side of the Y axis is defined as position S1'. Of two end positions in the Y axis direction of the bridging portion 184 of the second lead frame 179-1, the end position on the positive side of the Y axis is defined as position S2. Of two end positions in the Y axis direction of the bridging portion 184 of the first lead frame 178-1, the end position on the negative side of the Y axis is defined as position S2'. Of two end positions in the Y axis direction of the wiring joining portion 182 of the second lead frame 179-1, the end position on the positive side of the Y axis is defined as position S3. Of two end positions in the Y axis direction of the wiring joining portion 182 of the first lead frame 178-1, the end position on the negative side of the Y axis is defined as position S3'.

In this example, the position S1 is arranged on the negative side of the Y axis more than the position S2. In this example, the position S1' is arranged on the positive side of the Y axis more than the position S2'. In this example, the position S2 is arranged on the negative side of the Y axis more than the position S3. In this example, the position S2' is arranged on the positive side of the Y axis more than the position S3'.

The width between the position S1 and the position S1' in the Y axis direction is defined as the width W1. The width between the position S2 and the position S2' in the Y axis direction is defined as the width W2. The width between the position S3 and the position S3' in the Y axis direction is defined as the width W3.

In the semiconductor device 160 in this example, the width W2 is smaller than the width W1. Due to that, differences between lengths of current paths from the bridging portions 184 of the first lead frames 178 to the output terminal 199 and lengths of current paths from the bridging portions 184 of the second lead frames 179 to the output terminal 199 can be reduced, compared to the case that the width W2 is larger than the width W1.

The width W2 may be at least 50% and up to 90% of the width W1, or may be at least 50% and up to 80% of the width W1. When the width W2 is less than 50% of the width W1, distances in the Y axis direction between the first lead frames 178 and the second lead frames 179 are shorter, so that mutual inductances between the first lead frames 178 and the second lead frames 179 are likely to be larger. Due to that, preferably, the width W2 is 50% or more of the width W1.

The width W3 may be smaller than the width W1. When the width W3 is smaller than the width W1, differences between lengths of current paths from the wiring joining portions 182 of the first lead frames 178 to the output terminal 199 and lengths of current paths from the wiring joining portions 182 of the second lead frames 179 to the output terminal 199 can be reduced even more, compared to the case that the width W3 is larger than the width W1.

The width W3 may be smaller than the width W2. When the width W3 is smaller than the width W2, differences between lengths of current paths from the wiring joining portions 182 of the first lead frames 178 to the output terminal 199 and lengths of current paths from the wiring joining portions 182 of the second lead frames 179 to the output terminal 199 can be reduced even more, compared to the case that the width W3 is larger than the width W2.

Of two end positions in the Y axis direction of the bridging portion 184 of the second lead frame 179-1, the end position on the negative side of the Y axis is defined as position R. Of two end positions in the Y axis direction of the bridging portion 184 of the first lead frame 178-1, the end position on the positive side of the Y axis is defined as position R'.

The width between the position R and the position S1 in the Y axis direction is defined as the width W4. In addition, the width W4 is the width between the position R1' and the position S1' in the Y axis direction. The width between the position S1 and the position S2 in the Y axis direction is defined as the width W5. In addition, the width W5 is the width between the position S1' and the position S2' in the Y axis direction.

The width W5 may be equal to the width W4. The width W5 may be larger than the width W4. When the width W5 is equal to the width W4 or the width W5 is larger than the width W4, differences between lengths of current paths from the bridging portions 184 of the first lead frames 178 to the output terminal 199 and lengths of current paths from the bridging portions 184 of the second lead frames 179 to the output terminal 199 can be reduced, compared to the case that the width W5 is smaller than the width W4.

The chip joining portions 180, the wiring joining portions 182 and the bridging portions 184 each may be in a substantially rectangular shape in a top view. The chip joining portions 180, the wiring joining portions 182 and the bridging portions 184 may be arranged such that each longer side is parallel to the Y axis. The length of each longer side of the chip joining portions 180 and the wiring joining portions 182 may be shorter than the length of the longer side of the bridging portions 184 (the sum of the width W4 and the width W5).

The first lead frame 178-1 and the second lead frame 179-2 may have the same shape, and the first lead frame 178-2 and the second lead frame 179-1 may have the same shape. The first lead frames 178 and the second lead frames 179 may be arranged at substantially-mirror-symmetrical positions with respect to the ZX plane. The first lead frame 178-1 and the first lead frame 178-2 may be arranged at substantially-mirror-symmetrical positions with respect to the YZ plane. The second lead frame 179-1 and the second lead frame 179-2 may be arranged at substantially-mirror-symmetrical positions with respect to the YZ plane. The first lead frames 178 and the second lead frames 179 may be arranged at substantially-rotation-symmetrical positions with respect to the Z axis.

Figure 3:
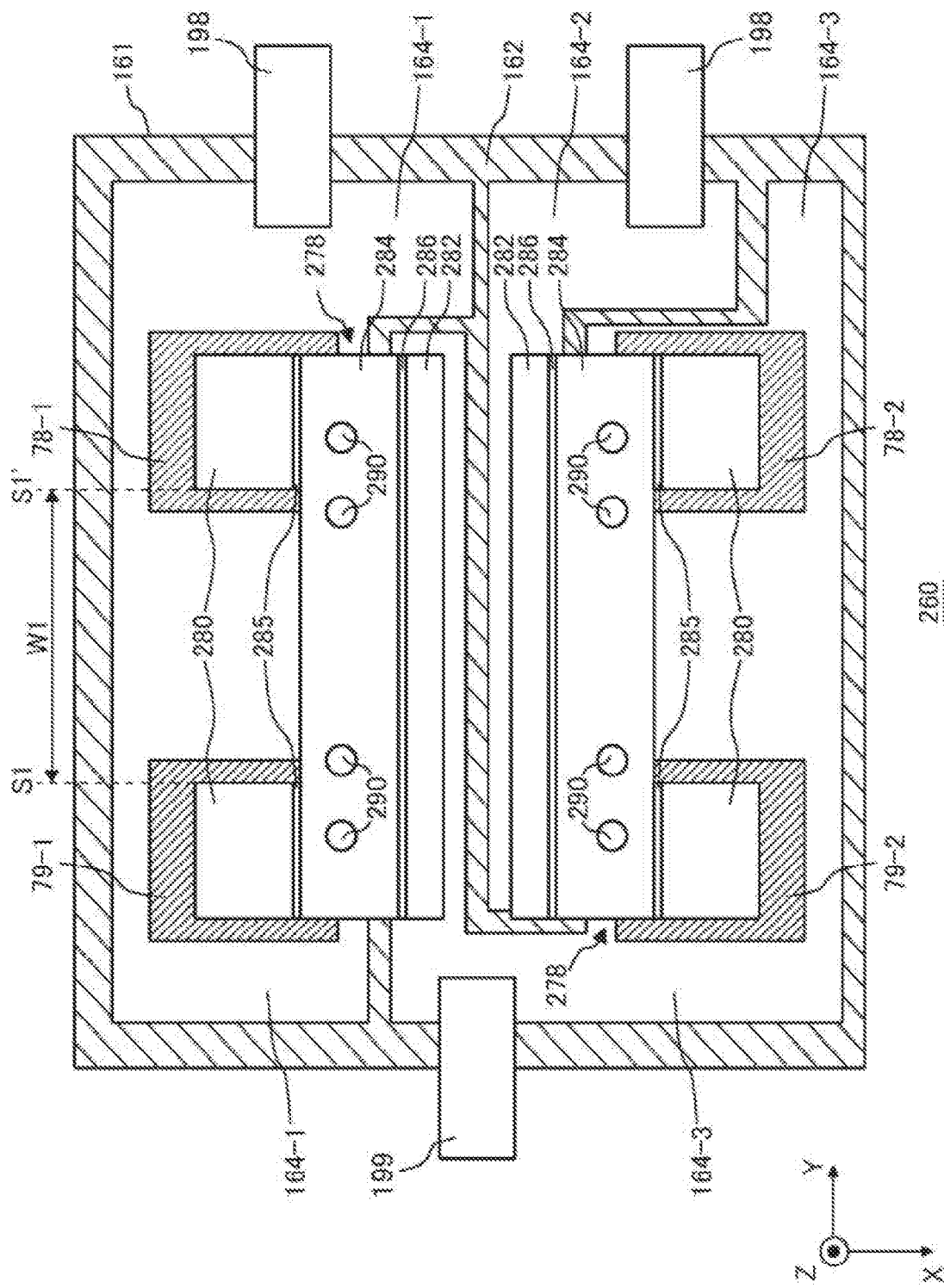
FIG. 3 is a diagram illustrating a semiconductor device 260 of a first comparative example.

FIG. 3 is a diagram illustrating a semiconductor device 260 of a first comparative example. The semiconductor device 260 of the first comparative example is different from the semiconductor device 160 in that lead frames 278 are connected to both the first semiconductor chips 78 and the second semiconductor chips 79. The lead frames 278 have chip joining portions 280, wiring joining portions 282, bridging portions 284, leg portions 285, and leg portions 286. In one bridging portion 284, four openings 290 are provided along the Y axis direction.

In the semiconductor device 260 of the first comparative example, both current caused by operations of the first semiconductor chips 78 and current caused by operations of the second semiconductor chips 79 flow through the lead frames 278. Due to that, in the semiconductor device 260 of the first comparative example, it is difficult to reduce an amount of heat generation of the lead frames 278. In addition, in the semiconductor device 260 of the first comparative example, differences between self-inductances of the lead frames 278 nearby the first semiconductor chips 78 and self-inductances of the lead frames 278 nearby the second semiconductor chips 79 are likely to increase. That is, in the semiconductor device 260 of the first comparative example, imbalance in self-inductances is likely to occur to the lead frames 278.

Figure 4:
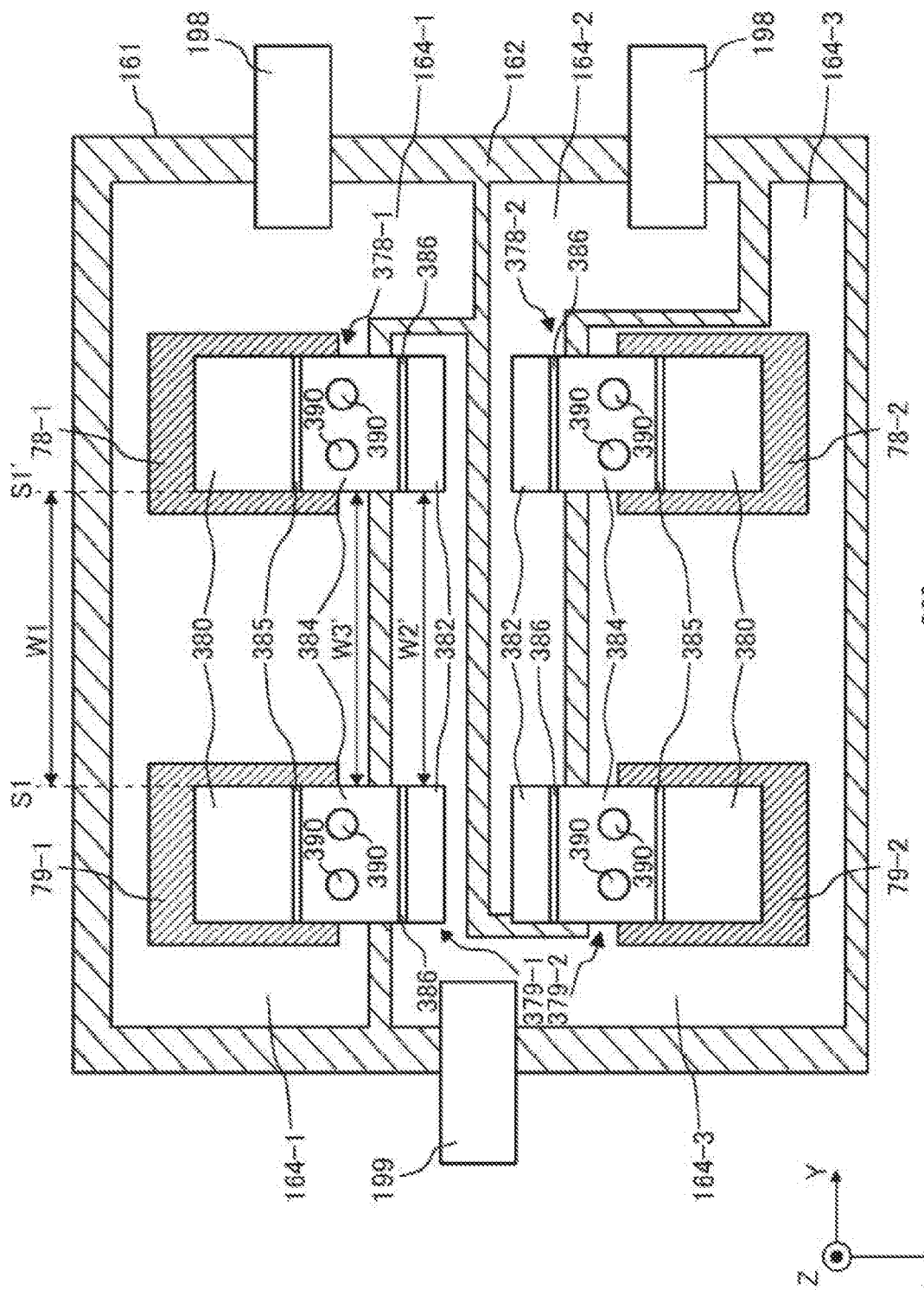
FIG. 4 is a diagram illustrating a semiconductor device 360 of a second comparative example.

FIG. 4 is a diagram illustrating a semiconductor device 360 of a second comparative example. In the semiconductor device 360 of the second comparative example, a first lead frame 378-1 is a first lead frame provided on the negative side of the X axis of two first lead frames 378 provided above an insulating plate 161. A first lead frame 378-2 is a first lead frame provided on the positive side of the X axis of the two first lead frames 378 provided above the insulating plate 161. A second lead frame 379-1 is a second lead frame provided on the negative side of the X axis of two second lead frames 379 provided above the insulating plate 161. A second lead frame 379-2 is a second lead frame provided on the positive side of the X axis of the two second lead frames 379 provided above the insulating plate 161.

In the semiconductor device 360, two openings 390 are provided in one bridging portion 384. The two openings 390 are provided along the Y axis direction.

In the semiconductor device 360 of the second comparative example, the position S1 is an end position on the positive side of the Y axis of two end positions of the chip joining portion 380 of the second lead frame 379-1 in the Y axis direction. In addition, the position S1 is an end position on positive side of the Y axis of two end positions of the bridging portion 384 of the second lead frame 379-1 in the Y axis direction. In addition, the position S1 is an end position on the positive side of the Y axis of two end positions of the wiring joining portion 382 of the second lead frame 379-1 in the Y axis direction.

In the semiconductor device 360 of the second comparative example, the position S1' is an end position on the negative side of the Y axis of two end positions of the chip joining portion 380 of the first lead frame 378-1 in the Y axis direction. In addition, the position S1' is an end position on the negative side of the Y axis of two end positions of the bridging portion 384 of the first lead frame 378-1 in the Y axis direction. In addition, the position S1' is an end position on the negative side of the Y axis of two end positions of the wiring joining portion 382 of the first lead frame 378-1 in the Y axis direction.

The width W2' is the width, in the Y axis direction, between the end position S1 on the positive side of the Y axis in the wiring joining portions 382 of the second lead frames 379 and the end position S1' on the negative side of the Y axis in the wiring joining portions 382 of the second lead frames 379. The width W3' is the width, in the Y axis direction, between the end position S1 on the positive side of the Y axis in the bridging portions 384 of the second lead frames 379 and the end position S1' on the negative side of the Y axis in the bridging portions 384 of the first lead frames 378.

In the semiconductor device 360 of the second comparative example, the width W2' and the width W3' are equal to the width W1. Due to that, differences between lengths of current paths from the wiring joining portions 382 of the first lead frames 378 to the output terminal 199 and lengths of current paths from the wiring joining portions 382 of the second lead frames 379 to the output terminal 199 are likely to increase.

Figure 5:
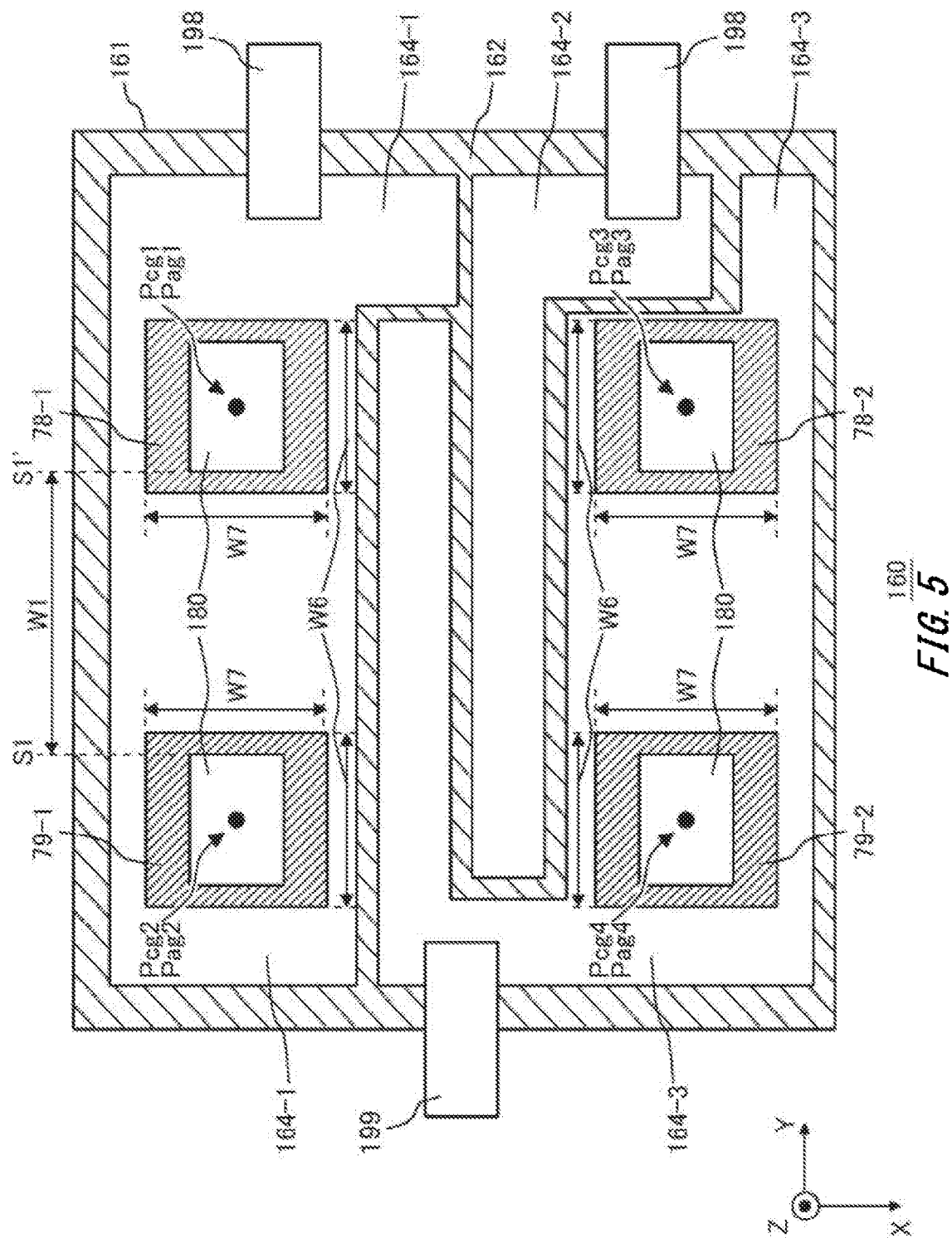
FIG. 5 is a diagram illustrating barycentric positions of first semiconductor chips 78 and second semiconductor chips 79, and chip joining portions 180.

FIG. 5 is a diagram illustrating barycentric positions of first semiconductor chips 78 and second semiconductor chips 79, and chip joining portions 180. The position Pcg1 is a barycentric position of a first semiconductor chip 78-1. The position Pcg2 is a barycentric position of a second semiconductor chip 79-1. The position Pcg3 is a barycentric position of a first semiconductor chip 78-2. The position Pcg4 is a barycentric position of a second semiconductor chip 79-2.

The position Pag1 is a barycentric position of the chip joining portion 180 provided above the first semiconductor chip 78-1. The position Pag2 is a barycentric position of the chip joining portion 180 provided above the second semiconductor chip 79-1. The position Pag3 is a barycentric position of the chip joining portion 180 provided above the first semiconductor chip 78-2. The position Pag4 is a barycentric position of the chip joining portion 180 provided above the second semiconductor chip 79-2.

In the specification, the center of gravity in the first semiconductor chips 78 refers to the center of gravity in a shape of the first semiconductor chips 78 in a top view. The center of gravity in the second semiconductor chips 79 refers to the center of gravity in a shape of the second semiconductor chips 79 in a top view. In addition, the center of gravity in the chip joining portions 180 refers to the center of gravity in a shape of the chip joining portions 180 in a top view.

In this example, the first semiconductor chips 78 are in a rectangular shape in a top view. Due to that, in this example, the center of gravity of the first semiconductor chips 78 refers to be positions in a top view in the first semiconductor chips 78, in which all distances from the four corners of the first semiconductor chips 78 are equal. In this example, the second semiconductor chips 79 are in a rectangular shape in a top view. Due to that, in this example, the center of gravity of the second semiconductor chips 79 refers to be positions in a top view in the second semiconductor chips 79, in which all distances from the four corners of the second semiconductor chips 79 are equal.

In a top view, the position Pag1 may be consistent with the position Pag1. In a top view, the position Pcg2 may be consistent with the position Pag2. In a top view, the position Pcg3 may be consistent with the position Pag3. In a top view, the position Pcg4 may be consistent with the position Pag4. When the position Pag1 is consistent with the position Pag1 in a top view, current flowing through from the first semiconductor chip 78-1 to the chip joining portion 180 provided above the first semiconductor chip 78-1 is unlikely to be imbalanced in the XY plane. When the position Pcg2 is consistent with the position Pag2 in a top view, current flowing through from the second semiconductor chip 79-1 to the chip joining portion 180 provided above the second semiconductor chip 79-1 is unlikely to be imbalanced in the XY plane.

The width W6 is the width of the first semiconductor chips 78 in the Y axis direction. The width W7 is the width of the first semiconductor chips 78 in the X axis direction. That in a top view the barycentric position Pag1 of the first semiconductor chip 78-1 is consistent with the barycentric position Pag1 of the chip joining portion 180 provided above the first semiconductor chip 78-1 may include the case that the distance in the Y axis direction between position Pcg1 and the position Pag1 is within 10% of the width W6. That in a top view the position Pag1 is consistent with the position Pag1 may include the case that the distance in the X axis direction between the position Pcg1 and the position Pag1 is within 10% of the width W7. The same applies to the position Pcg3 and the position Pag3.

The width of the second semiconductor chips 79 in the Y axis direction may equal to the width W6. The width of the second semiconductor chips 79 in the X axis direction may equal to the width W7. That in a top view the position Pcg2 is consistent with the position Pag2 may include the case that the distance in the Y axis direction between the position Pcg2 and the position Pag2 is within 10% of the width W6. That in a top view the position Pcg2 is consistent with the position Pag2 may include the case that the distance in the X axis direction between the position Pcg2 and the position Pag2 is within 10% of the width W7. The same applies to the position Pcg4 and the position Pag4.

Figure 6:
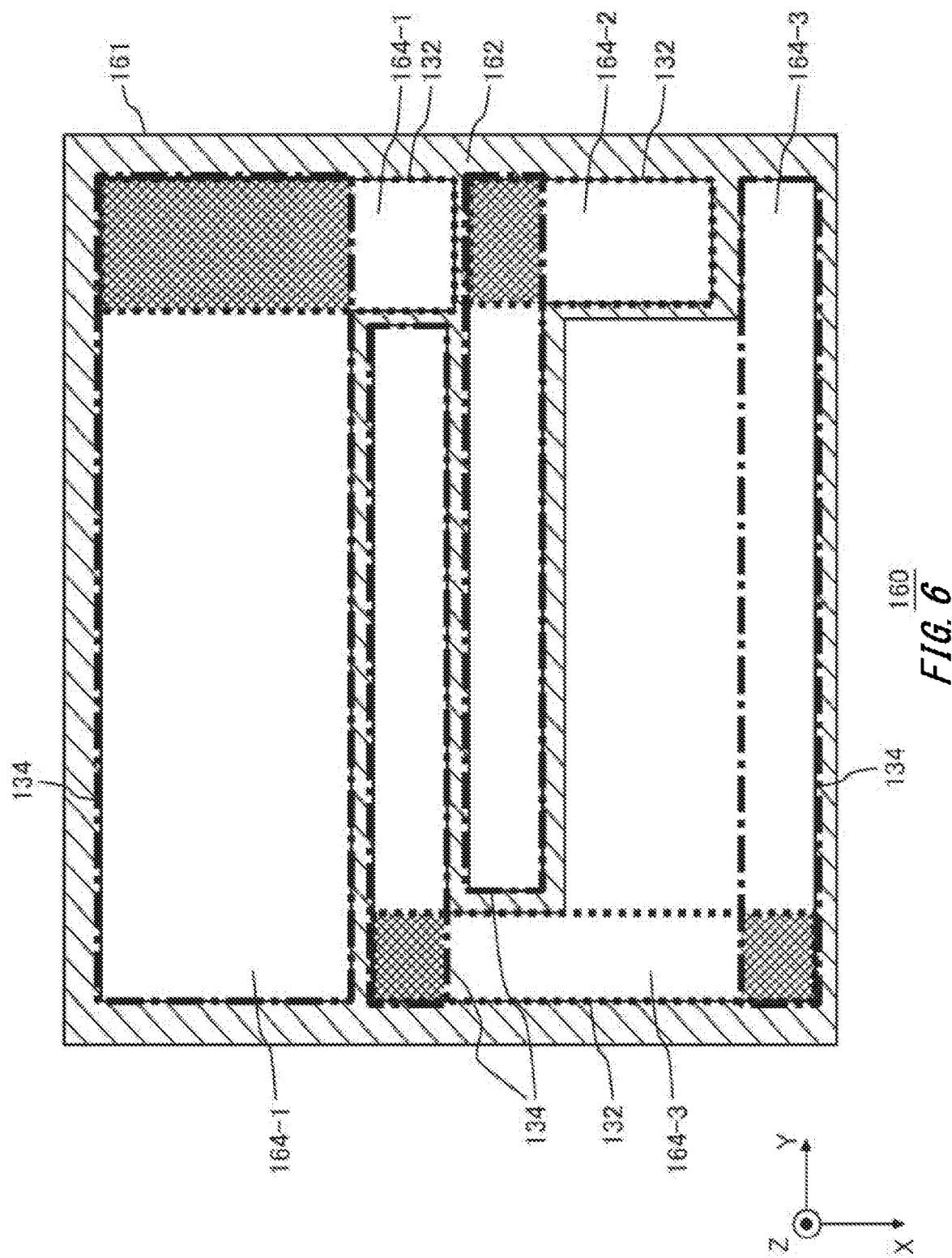
FIG. 6 is a diagram illustrating shapes of wiring patterns 164 in a top view.

FIG. 6 is a diagram illustrating shapes of wiring patterns 164 in a top view. In FIG. 6, the first semiconductor chips 78 and the second semiconductor chips 79, the first lead frames 178 and the second lead frames 179, and the power source terminals 198 and the output terminal 199 are omitted.

Wiring patterns 164 include first wiring patterns 134 and second wiring patterns 132. In the first wiring patterns 134, a first direction (Y axis direction) is defined as the longitudinal direction. In FIG. 6, the scope of the first wiring patterns 134 is indicated with bold dashed-dotted lines. In the second wiring patterns 132, a second direction (x axis direction) perpendicular to the first direction in the XY plane is defined as the longitudinal direction. In FIG. 6, the scope of the second wiring patterns 132 is indicated with bold dashed lines. The first wiring patterns 134 and the second wiring patterns 132 may be overlapped in shaded areas in FIG. 6.

In a wiring pattern 164-1 and a wiring pattern 164-2, the first wiring patterns 134 and the second wiring patterns 132 may be arranged in an L-shape in a top view. The first wiring patterns 134 and the second wiring patterns 132 may be also arranged in a T-shape in a top view. The first wiring patterns 134 and the second wiring patterns 132 may be also arranged in a cross-shape in a top view.

In a wiring pattern 164-3, the second wiring pattern 132 and one first wiring pattern 134 may be arranged in an L-shape in a top view. The second wiring pattern 132 and one first wiring pattern 134 may be also arranged in a T-shape in a top view. The second wiring pattern 132 and one first wiring pattern 134 may be also arranged in a cross-shape in a top view.

Figure 7:
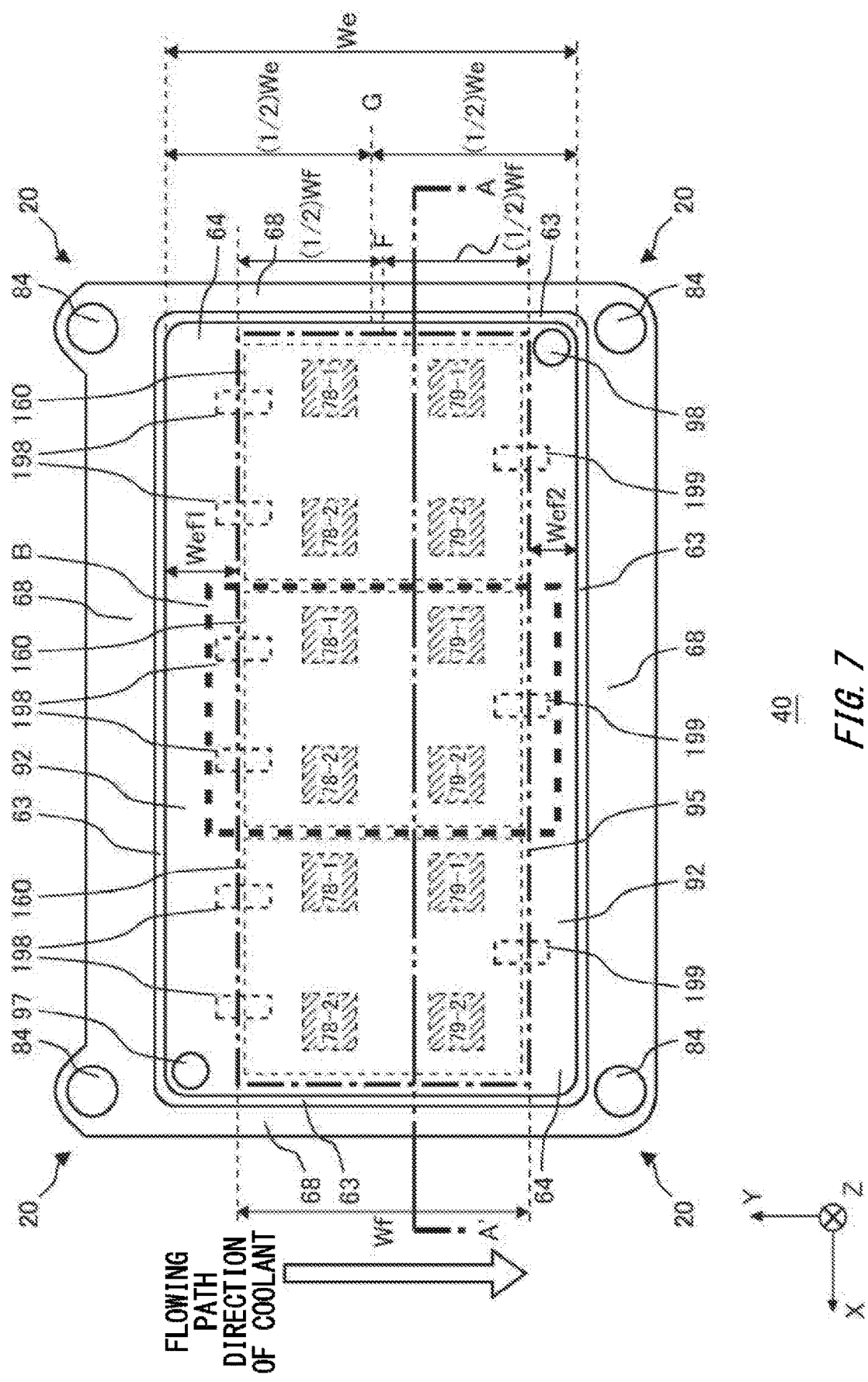
FIG. 7 is a diagram illustrating an example of the lower surface of a casing portion 40 according to one embodiment of the present invention.

FIG. 7 is a diagram illustrating an example of the lower surface of a casing portion 40 according to one embodiment of the present invention. The casing portion 40 is arranged below the top plate 94 shown in FIG. 1 (that is, on the negative side of the Z axis). FIG. 7 is a diagram in the case that the casing portion 40 is seen from the negative side of the Z axis to the positive side. In FIG. 7, positions of the first semiconductor chips 78 and the second semiconductor chips 79 in a bottom view are indicated with dashed lines and hatching. In addition, positions of the power source terminals 198 and output terminals 199 are indicated with dashed lines in a bottom view.

The casing portion 40 may be formed of metal having the same composition as the top plate 94. The casing portion 40 may be formed of metal containing aluminum or copper. The casing portion 40 has a side wall 63 and a bottom plate 64. The casing portion 40 includes a coolant flowing portion 92 for the coolant to flow and an outer edge portion 68 surrounding the coolant flowing portion 92. The coolant flowing portion 92 is a space defined by the side wall 63 and the bottom plate 64.

The casing portion 40 includes cooling fins 95 arranged on the coolant flowing portion 92. The cooling fins 95 are provided in a predefined region, with the cooling fins 95 overlapping with at least a part of the semiconductor device 160 in a top view and a bottom view. In this example, the cooling fins 95 are provided, with it overlapping with the entire semiconductor device 160 in a top view and a bottom view. In FIG. 7, the scope in which the cooling fins 95 are provided in a bottom view is indicated with dashed-dotted lines.

The casing portion 40 has four corners 20 in a bottom view. In this example, the four corners 20 refers to portions overlapping with the corners 19 (refer to FIG. 1) of the terminal casing 88 in a bottom view and a top view.

The casing portion 40 may have through-holes 84. The through-holes 84 are provided at the same position as the through-holes 84 provided in the terminal casing 88 in a top view and a bottom view.

The casing portion 40 has a coolant inlet port 97 for introducing coolant into the coolant flowing portion 92 and a coolant outlet port 98 for leading out the coolant from the coolant flowing portion 92. The coolant inlet port 97 may be provided nearby one corner 20. The coolant outlet port 98 may be provided nearby other corner 20 diagonally located relative to said one corner 20.

In this example, the coolant is introduced from the coolant inlet port 97 and led out from the coolant outlet port 98. In this example, one side close to the coolant inlet port 97 is defined as the upstream side, and another side close to the coolant outlet port 98 is defined as the downstream side, in the Y axis direction. In FIG. 7, a flowing path direction of the coolant in the cooling fins 95 is indicated with a bold arrow. In the cooling fins 95 of this example, the flowing path direction of the coolant is the Y axis direction.

The power source terminals 198 may be arranged on the upstream side of the flowing path of the coolant. The output terminals 199 may be arranged on the downstream side of the flowing path of the coolant.

The width in the Y axis direction of the cooling fins 95 is defined as the width Wf. The width in the Y axis direction of the coolant flowing portion 92 is defined as the width We. The position F is the center position of the cooling fins 95 in the Y axis direction. The position G is the center position of the coolant flowing portion 92 in the Y axis direction.

The width in the Y axis direction between the ends of the cooling fins 95 on the positive side of the Y axis and the position of the inner surface of the side wall 63 on the positive side of the Y axis of the two side walls 63 extending in the X axis direction is defined as width Wef1. The width in the Y axis direction between the ends of the cooling fins 95 on the negative side of the Y axis and the position of the inner surface of the side wall 63 on the negative side of the Y axis of the two side walls 63 extending in the X axis direction is defined as the width Wef2.

In the flowing path direction of the coolant (Y axis direction), the position F may be arranged on the downstream side of the flowing path of the coolant, compared to the position G. The width Wef2 may be smaller than the width Wef1. That is, the cooling fins 95 may be arranged in the coolant flowing portion 92 to be shifted on the negative side of the Y axis relative to the center of the coolant flowing portion 92 in the Y axis direction. Note that the sum of the width Wef1, the width Wef2, and the width Wf is equal to the width We.

The coolant flowing through the coolant flowing portion 92 cools the first semiconductor chips 78, and then cools the second semiconductor chips 79. Due to that, the temperature of the coolant that cools the second semiconductor chips 79 is likely to higher than the temperature of the coolant flowing through nearby the coolant inlet port 97. The semiconductor module 100 in this example enables the cooling performance in cooling the second semiconductor chips 79 arranged on the downstream side of flowing path of the coolant to be improved, because the position F is arranged on the downstream side of the flowing path of the coolant from the position G, thereby lessening the flow velocity distribution of the coolant in the X axis direction, compared to the case that the position F is arranged on the upstream side of the flowing path of the coolant from the position G.

Figure 8:
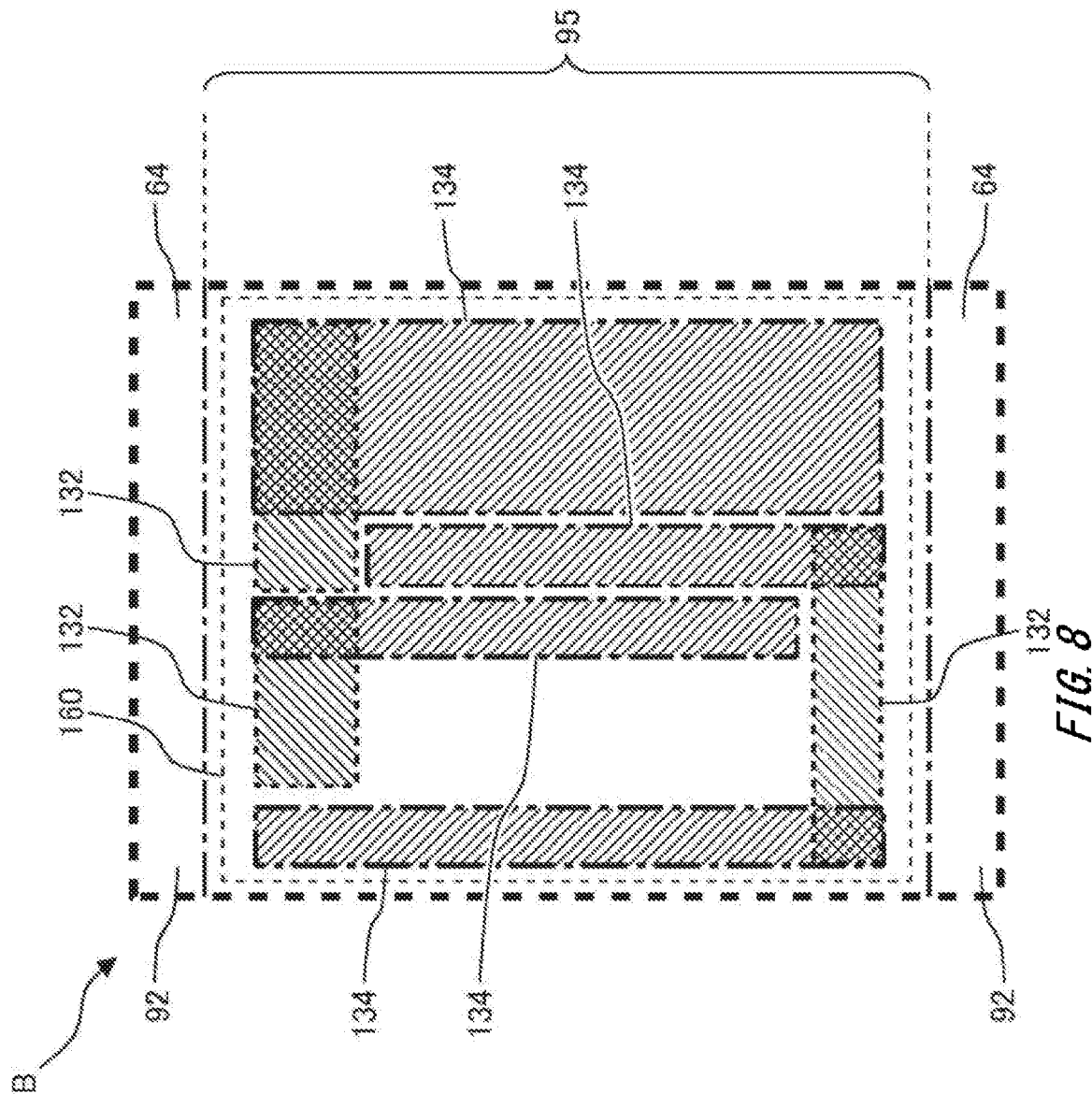
FIG. 8 is an enlarged view of the region B in FIG. 7.

FIG. 8 is an enlarged view of the region B in FIG. 7. FIG. 8 indicates the region including one semiconductor device 160 with it enlarged in a bottom view. In FIG. 8, the position of the first wiring patterns 134 (refer to FIG. 6) in a bottom view is indicated with dashed-dotted lines and hatching. In addition, the position of the second wiring patterns 132 (refer to FIG. 6) in a bottom view is indicated with dashed lines and hatching. In addition, in FIG. 8, the position of the first semiconductor chips 78 and the position of the second semiconductor chips 79 in a bottom view are omitted.

The entire first wiring patterns 134 and second wiring patterns 132 may be arranged to overlap with the cooling fins 95 in a top view and a bottom view. The wiring patterns 164 generates heat by current flowing through the wiring patterns 164. Due to that, the entire first wiring patterns 134 and second wiring patterns 132 is arranged to overlap with the cooling fins 95 in a top view and a bottom view, thereby enabling the entire wiring patterns 164 to be cooled. This enables the cooling performance in cooling the semiconductor device 160 to be improved.

Figure 9:
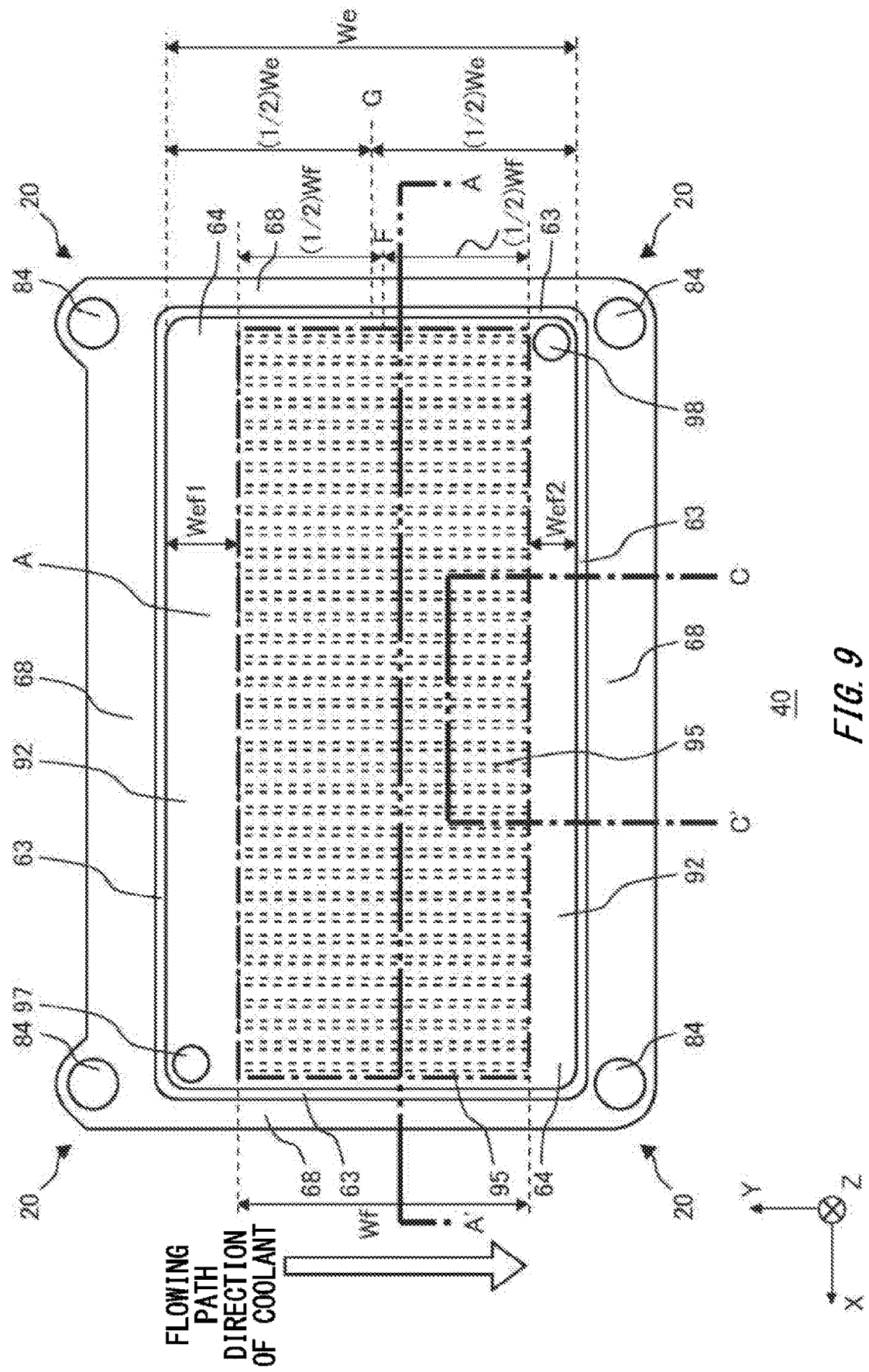
FIG. 9 is a diagram illustrating an example of an arrangement of cooling fins 95 in FIG. 7.

FIG. 9 is a diagram illustrating an example of an arrangement of the cooling fins 95 in FIG. 7. The cooling fins 95 in this example extend along a first direction (Y axis direction) and are provided side-by-side in a second direction (X axis direction). In this example, the cooling fins 95 have a rectangular shape with the first direction defined as the longitudinal direction. In addition, in this example, a plurality of cooling fins 95 in a rectangular shape is arranged at predetermined intervals in the X axis direction. The cooling fins 95 may be wavy fins, pin fins, corrugated fins, or stacked fins, in addition to straight fins.

The cooling fins 95 may be formed of metal having the same composition as the casing portion 40. The cooling fins 95 are formed of metal containing, for example, aluminum or copper. Preferably, the cooling fins 95 are formed of metal containing aluminum to minimize their weight.

Figure 10:
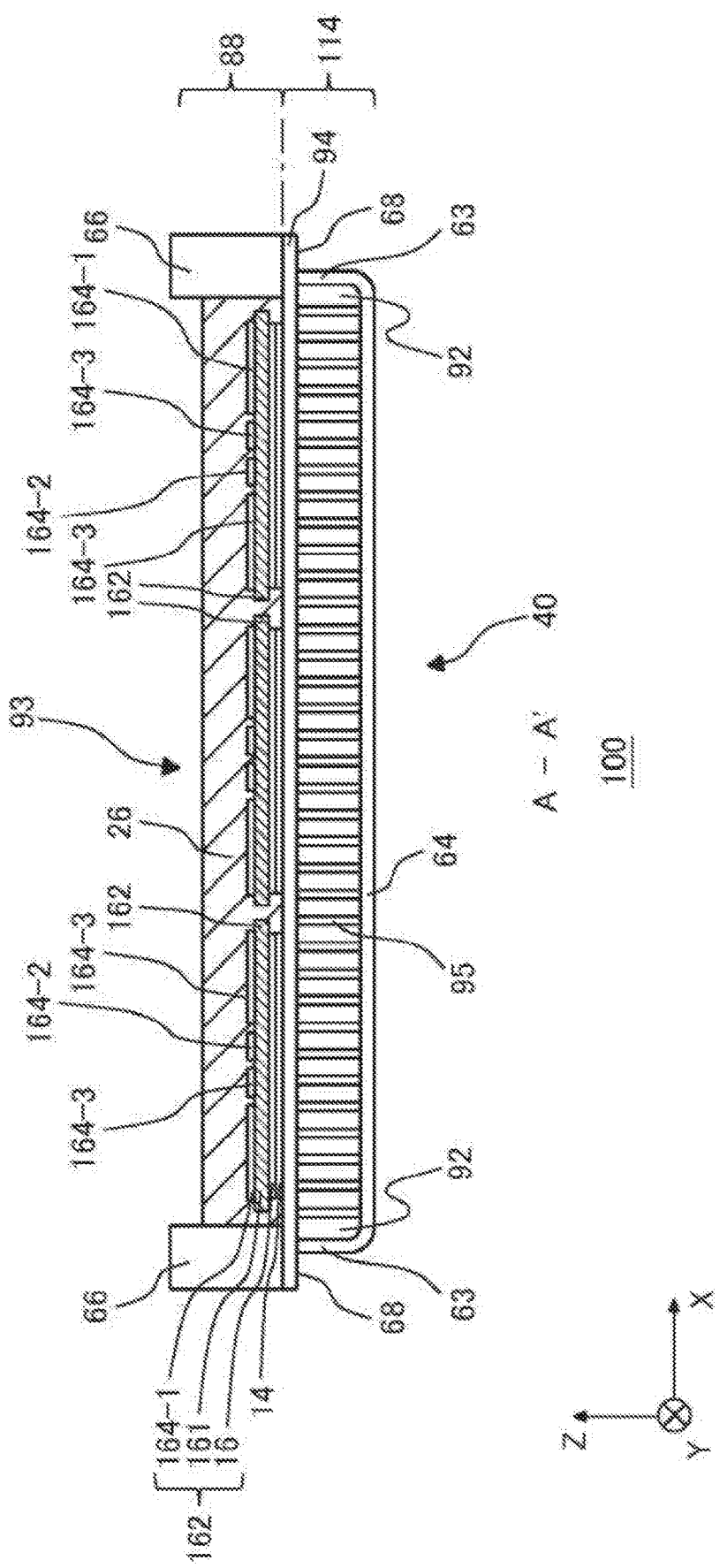
FIG. 10 is a diagram illustrating an example of the A-A' cross section in FIG. 1 and FIG. 9.

FIG. 10 is a diagram illustrating an example of the A-A' cross section in FIG. 1 and FIG. 9. The A-A' cross section is the XZ cross section through wiring patterns 164 and an insulating plate 161 of a semiconductor device 160, a top plate 94, and side walls 66 of a terminal casing 88. The A-A' cross section is also the XZ cross section through side walls 63 of a casing portion 40, a bottom plate 64, a coolant flowing portion 92, and cooling fins 95.

A semiconductor module 100 of this example includes the terminal casing 88, and a cooling portion 114 arranged below the terminal casing 88. The cooling portion 114 has the top plate 94 with the lower surface and the casing portion 40. The casing portion 40 includes the coolant flowing portion 92 and an outer edge portion 68. In addition, the casing portion 40 is arranged on the lower surface side of the top plate 94 and arranged to directly or indirectly adhere to the lower surface of the top plate 94 at the outer edge portion 68.

A circuit board 162 has the insulating plate 161, the wiring patterns 164, and a conductor layer 16. The conductor layer 16 is provided below the insulating plate 161. The wiring patterns 164 and the conductor layer 16 are formed of a conductive material or metal material, for example, copper or the like. The conductor layer 16 is provided on almost entire plane of the lower surface of the insulating plate 161. Above the insulating plate 161, the wiring patterns 164 are provided.

Below the conductor layer 16, a joining material 14 is provided. The joining material 14 is solder as an example. The joining material 14 joins the conductor layer 16 and the top plate 94. Heat generated by operations of the semiconductor device 160 is emitted outside of the semiconductor device 160 through the top plate 94.

The terminal casing 88 has side walls 66 and an opening 93 surrounded by the side walls 66. In the opening 93, a sealant 26 such as epoxy resin or silicone gel is filled. The semiconductor device 160 may be sealed with the sealant 26. The lower surface of the sealant 26 may contact with the upper surface of the top plate 94. The upper surface of the sealant 26 may be arranged below the upper surface of the side walls 66.

One end of the cooling fin 95 on the positive side of the Z axis may contact with the lower surface of the top plate 94.

The lower surface of the top plate 94 is a surface, of the top plate 94, facing the coolant flowing portion 92 of the casing portion 40 in the Z axis direction. The other end of the cooling fin 95 on the negative side of the Z axis may contact with the upper surface of the bottom plate 64.

The casing portion 40 and the cooling fins 95 may be formed by stamping, forging, or extrusion processing. The casing portion 40 and the cooling fins 95 may be assembled by brazing processing. A brazing material may be formed of metal with lower melting point than that of the casing portion 40. Metal containing copper or aluminum as metal with low melting point may be used for the brazing material.

Figure 11:
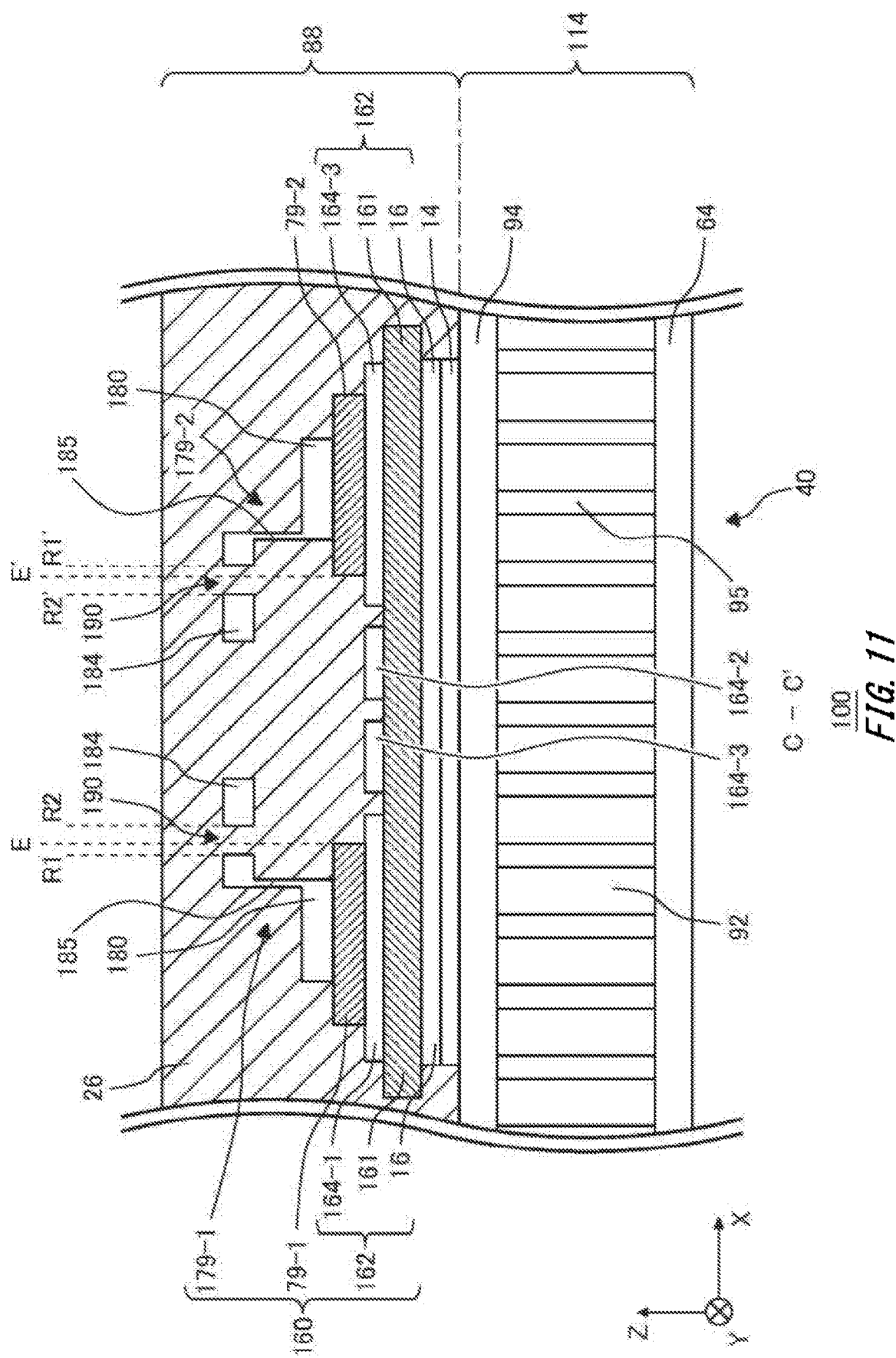
FIG. 11 is a diagram illustrating an example of the C-C' cross section in FIG. 1 and FIG. 9.

FIG. 11 is a diagram illustrating an example of the C-C' cross section in FIG. 1 and FIG. 9. The C-C' cross section is the XZ cross section through wiring patterns 164 of semiconductor device 160, an insulating plate 161, a conductor layer 16, second semiconductor chips 79, second lead frames 179, and openings 190. The C-C' cross section is also the XZ cross section through a top plate 94, a bottom plate 64 of a casing portion 40, coolant flowing portions 92, and cooling fins 95.

The semiconductor device 160 includes the second semiconductor chips 79, the second lead frames 179, and a circuit board 162. The semiconductor device 160 is joined to the upper surface of the top plate 94 by a joining material 14.

Of two end positions in the X axis direction of the opening 190 provided in the second lead frame 179-1, the end position on the negative side of the X axis is defined as the position R1'. Of the two end positions, the end position on the positive side of the X axis is defined as the position R2. In addition, of two end positions in the X axis direction of the second semiconductor chip 79-1, the end position on the positive side of the X axis is defined as the position E.

Of two end positions in the X axis direction of the opening 190 provided in the second lead frame 179-2, the end position on the positive side of the X axis is defined as the position R1'. Of the two end positions, the end position on the negative side of the X axis is defined as the position R2'. In addition, the end position on the negative side of the X axis of the second semiconductor chip 79-2 is defined as the position E'.

In the X axis direction, the position E may be arranged between the position R1 and the position R2. In the X axis direction, the position E' may be arranged between the position R1' and the position R2'. When the position E is arranged between the position R1 and the position R2 in the X axis direction, sealant 26 inflowing from the opening 190 is likely to be filled into the space surrounded by a leg portion 185, a leg portion 186, and a bridging portion 184. In addition, when the position E' is arranged between the position R1' and the position R2' in the X axis direction, the sealant 26 inflowing from the opening 190 is likely to be filled into the space surrounded by the leg portion 185, the leg portion 186, and the bridging portion 184.

Figure 12:
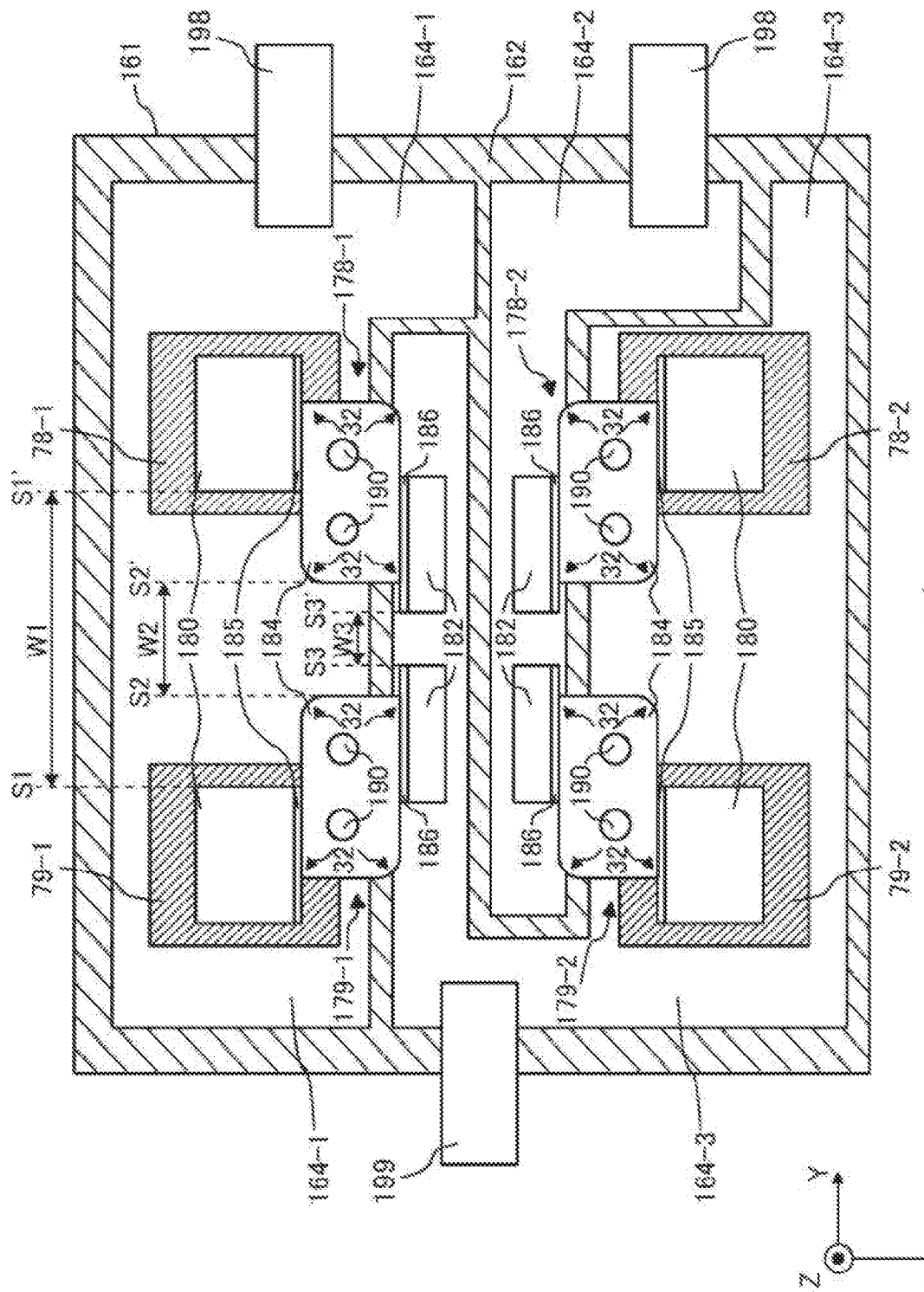
FIG. 12 is a diagram illustrating another example of the upper surface of the semiconductor device 160.

FIG. 12 is a diagram illustrating another example of the upper surface of a semiconductor device 160. The semiconductor device 160 of this example is different from the semiconductor device 160 in FIG. 2 in that at least one corner 32 of one bridging portion 184 is provided in a curved shape in a top view. In this example, of four corners 32 of one bridging portion 184, two corner 32 diagonally located are provided in a curved shape in a top view. The corners 32 that do not contact with the leg portion 185 and the leg portion 186 may be provided in a curved shape in a top view.

In the semiconductor device 160 of this example, at least one corner 32 of one bridging portion 184 is provided in a curved shape. Due to that, it is less likely for the stress in the X axis direction and the stress in the Y axis direction to overlap and be applied to the sealant 26 filled nearby the corner 32. Due to that, the sealant 26 and the bridging portion 184 is less likely to be deformed by the stress.

Figure 13:
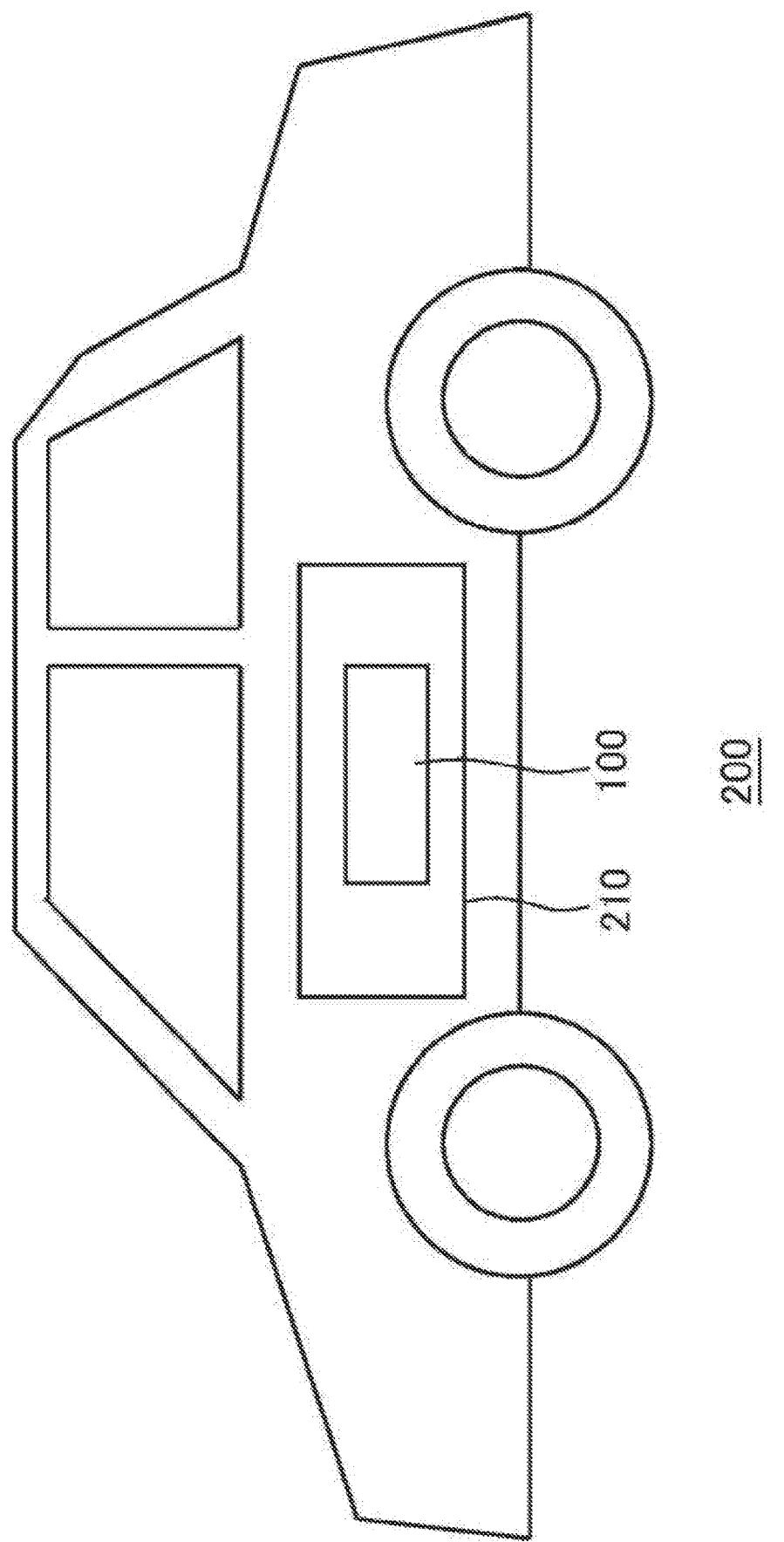
FIG. 13 is a diagram illustrating an overview of a vehicle 200 according to one embodiment of the present invention.

FIG. 13 is a diagram illustrating an overview of a vehicle 200 according to one embodiment of the present invention. The vehicle 200 is a vehicle that generates at least a part of driving force by using electrical power. As an example, the vehicle 200 is an electric vehicle that generates the whole of driving force by using an electrically-driven device such as a motor, or a hybrid vehicle using both an electrically-driven device such as a motor and an internal-combustion engine driven by fuel such as gasoline.

The vehicle 200 include a control device 210 (external device) for controlling an electrically-driven device such as a motor. In the control device 210, a semiconductor module 100 is provided. The semiconductor module 100 may control electrical power supplied to the electrically-driven device.

Figure 14:
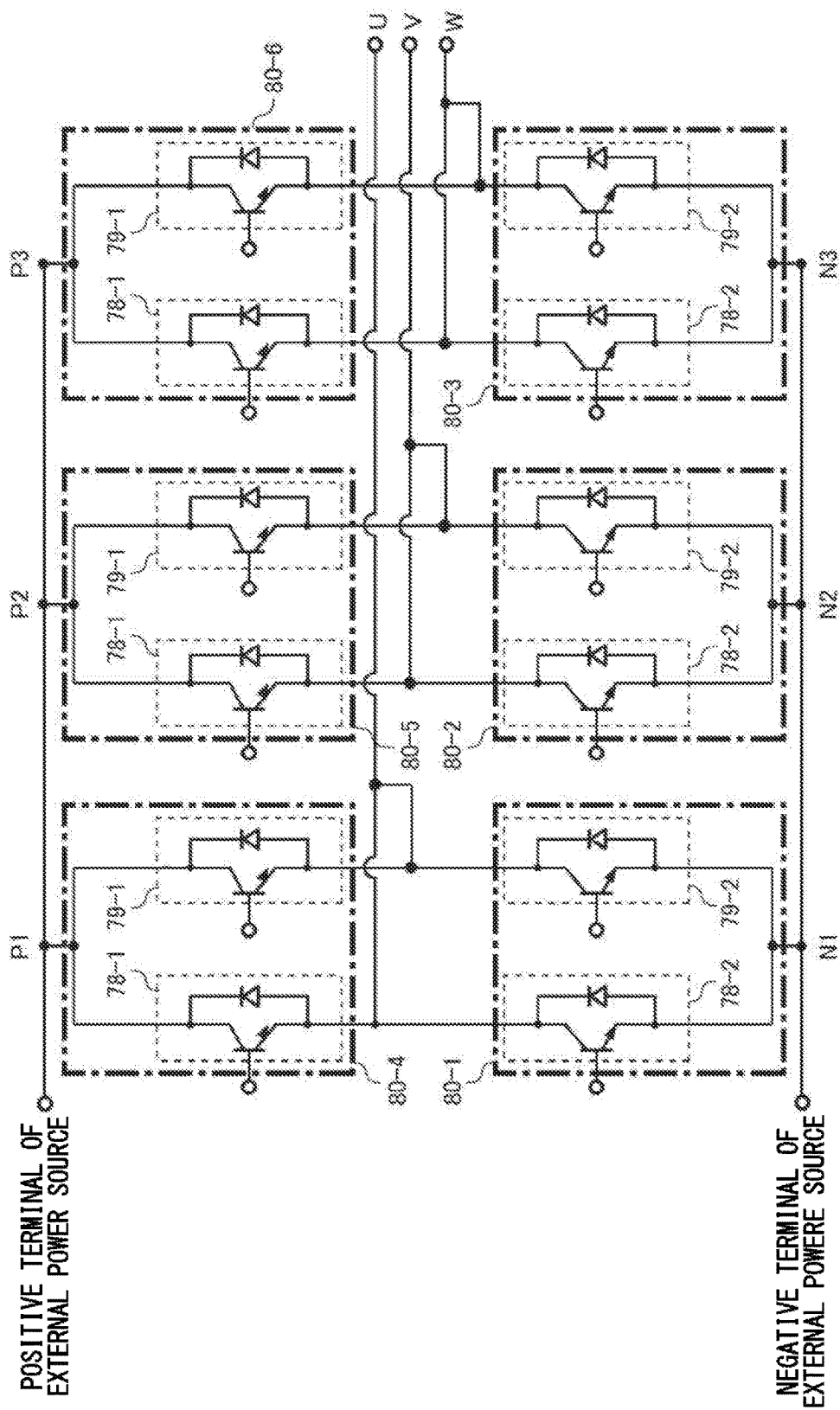
FIG. 14 is a main circuit schematic of the semiconductor module 100 according to one embodiment of the present invention.

FIG. 14 is a main circuit schematic of a semiconductor module 100 according to one embodiment of the present invention. The semiconductor module 100 may be a part of an in-vehicle unit for driving a motor in a vehicle. The semiconductor module 100 may function as a three-phase AC inverter circuit having an output terminals U, V, and W.

Semiconductor chips in which first semiconductor chips 78 and second semiconductor chips 79 are connected in parallel are defined as semiconductor chips 80. A semiconductor chip 80-1, a semiconductor chip 80-2, and a semiconductor chip 80-3 may configure a lower arm in a semiconductor module 100. A semiconductor chip 80-4, a semiconductor chip 80-5, and a semiconductor chip 80-6 may configure an upper arm in the semiconductor module 100. A set of the semiconductor chip 80-1 and the semiconductor chip 80-4 may configure a leg. A set of the semiconductor chip 80-2 and the semiconductor chip 80-5 may configure a leg. A set of the semiconductor chip 80-3 and the semiconductor chip 80-6 may configure a leg.

In the semiconductor chip 80-1, emitter electrodes of the first semiconductor chip 78-2 and the second semiconductor chip 79-2 and collector electrodes of the first semiconductor chip 78-2 and the second semiconductor chip 79-2 may be electrically connected to an input terminal N1 and an output terminal U, respectively. In the semiconductor chip 80-4, emitter electrodes of the first semiconductor chip 78-1 and the second semiconductor chip 79-1 and collector electrodes of the first semiconductor chip 78-1 and the second semiconductor chip 79-1 may be electrically connected to the output terminal U and the input terminal P1, respectively.

In the semiconductor chip 80-2, emitter electrodes of the first semiconductor chip 78-2 and the second semiconductor chip 79-2 and collector electrodes of the first semiconductor chip 78-2 and the second semiconductor chip 79-2 may be electrically connected to an input terminal N2 and an output terminal V, respectively. In the semiconductor chip 80-5, emitter electrodes of the first semiconductor chip 78-1 and the second semiconductor chip 79-1 and collector electrodes of the first semiconductor chip 78-1 and the second semiconductor chip 79-1 may be electrically connected to the output terminal V and the input terminal P2, respectively.

In the semiconductor chip 80-3, emitter electrodes of the first semiconductor chip 78-2 and the second semiconductor chip 79-2 and collector electrodes of the first semiconductor chip 78-2 and the second semiconductor chip 79-2 may be electrically connected to an input terminal N3 and an output terminal W, respectively. In the semiconductor chip 80-6, emitter electrodes of the first semiconductor chip 78-1 and the second semiconductor chip 79-1 and collector electrodes of the first semiconductor chip 78-1 and the second semiconductor chip 79-1 may be electrically connected to the output terminal W and the input terminal P3, respectively.

The semiconductor chip 80-1 to the semiconductor chip 80-6 may be alternatively switched by signals inputted to controlling electrode pads of the first semiconductor chips 78 and the second semiconductor chips 79. In this example, the first semiconductor chips 78 and the second semiconductor chips 79 may generate heat during switching.

The input terminals P1, P2, and P3 may be connected to the positive terminal of an external power source. The input terminals N1, N2, and N3 may be connected to the negative terminal of the external power source. The input terminals P1, P2, and P3 may be electrically connected to each other. The input terminals N1, N2, and N3 may be electrically connected to each other. Each of the output terminals U, V, and W may be connected to a load.

In the semiconductor module 100, each of the first semiconductor chips 78 and the second semiconductor chips 79 may be an RC-IGBT (Reverse-Conducting IGBT) semiconductor chip. In the RC-IGBT semiconductor chip, the IGBT and the freewheeling diode (FWD) may be integrally formed. In the RC-IGBT semiconductor chip, the IGBT and the FWD may be connected in antiparallel. The first semiconductor chips 78 and the second semiconductor chips 79 may each include a combination of the transistor such as the MOSFET and the IGBT, and the diode.

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, and drawings, it does not necessarily mean that the process must be performed in this order.

EXPLANATION OF REFERENCES

14: joining material, 16: conductor layer, 19: corner, 20: corner, 26: sealant, 32: corner, 40: casing portion, 63: side wall, 64: bottom plate, 65: side wall, 66: side wall, 68: outer edge portion, 78: first semiconductor chip, 79: second semiconductor chip, 80: semiconductor chip, 84: through-hole, 86: main terminal, 88: terminal casing, 92: coolant flowing portion, 93: opening, 94: top plate, 95: cooling fin, 97: coolant inlet port, 98: coolant outlet port, 100: semiconductor module, 114: cooling portion, 132: second wiring pattern, 134: first wiring pattern, 160: semiconductor device, 161: insulating plate, 162: circuit board, 164: wiring pattern, 178: first lead frame, 179: second lead frame, 180: chip joining portion, 182: wiring joining portion, 184: bridging portion, 185: leg portion, 186: leg portion, 190: opening, 198: power source terminal, 199: output terminal, 200: vehicle, 210: control device, 260: semiconductor device, 278: lead frame, 280: chip joining portion, 282: wiring joining portion, 284: bridging portion, 285: leg portion, 286: leg portion, 290: opening, 360: semiconductor device, 378: first lead frame, 379: second lead frame, 380: chip joining portion, 382: wiring joining portion, 384: bridging portion

What is claimed is:

1. A semiconductor device comprising:
    a circuit board;
    a wiring pattern provided above the circuit board;
    a first semiconductor chip and a second semiconductor chip that are provided above the circuit board and that are provided along a first direction predefined in a plane parallel to a board surface of the circuit board;
    a first lead frame for electrically connecting the first semiconductor chip and the wiring pattern; and
    a second lead frame for electrically connecting the second semiconductor chip and the wiring pattern; wherein
    the first lead frame and the second lead frame each comprises:
        a chip joining portion provided above at least a part of the first semiconductor chip and the second semiconductor chip;
        a wiring joining portion provided above at least a part of the wiring pattern; and
        a bridging portion for connecting the chip joining portion and the wiring joining portion; and
    in the first direction, a first space between the bridging portion of the first lead frame and the bridging portion of the second lead frame is smaller than a second space between the chip joining portion of the first lead frame and the chip joining portion of the second lead frame, wherein the bridging portion of the first lead frame and the bridging portion of the second lead frame are parallel to each other.

2. The semiconductor device according to claim 1, wherein
    in the first direction, a third space between the wiring joining portion of the first lead frame and the wiring joining portion of the second lead frame is smaller than the second space between the chip joining portion of the first lead frame and the chip joining portion of the second lead frame.

3. The semiconductor device according to claim 1, wherein
    in the first direction, a third space between the wiring joining portion of the first lead frame and the wiring joining portion of the second lead frame is smaller than the first space between the bridging portion of the first lead frame and the bridging portion of the second lead frame.

4. The semiconductor device according to claim 1, wherein
    a barycentric position of the first semiconductor chip is aligned with a barycentric position of the chip joining portion in the first lead frame; and
    a barycentric position of the second semiconductor chip is aligned with a barycentric position of the chip joining portion in the second lead frame.

5. The semiconductor device according to claim 1, wherein
    in a top view, at least one corner of the bridging portion is provided in a curved shape.

6. The semiconductor device according to claim 1, wherein
    in the bridging portion a first opening is provided, which passes through from an upper surface to a lower surface of the bridging portion.

7. The semiconductor device according to claim 6, wherein
an end of the first semiconductor chip or the second semiconductor chip in a second direction perpendicular to the first direction in the plane is arranged between two end positions of a second opening in the second direction.

8. The semiconductor device according to claim 7, wherein
the bridging portion is in a rectangular shape.

9. The semiconductor device according to claim 1, wherein
the first lead frame and the second lead frame each further comprises a leg portion for connecting the chip joining portion and the bridging portion; and
at an end of the bridging portion, which contacts with the leg portion in a second direction perpendicular to the first direction in the plane, a width of the first direction in which the bridging portion does not contact with the leg portion is larger than a width of the first direction in which the bridging portion contacts with the leg portion.

10. The semiconductor device according to claim 1, wherein
a width of the bridging portion in the first direction is larger than a width of the chip joining portion in the first direction; and
the width of the bridging portion in the first direction is larger than a width of the wiring joining portion in the first direction.

11. A semiconductor module comprising:
a terminal casing which houses the semiconductor device according to claim 1; and
a cooling portion arranged below the terminal casing, wherein the cooling portion comprises:
a top plate having a lower surface; and
a casing portion that includes a coolant flowing portion for coolant to flow and an outer edge portion surrounding the coolant flowing portion, wherein the coolant flowing portion is arranged on the lower surface of the top plate, and that is arranged to directly or indirectly adhere to the lower surface at the outer edge portion; wherein
the casing portion includes a cooling fin that is arranged on the coolant flowing portion and that is provided in a predefined region with the cooling fin overlapping with at least a part of the semiconductor device according to claim 1 in a top view; and
in a direction of a flowing path of the coolant, a center of the cooling fin is arranged on a downstream side of the flowing path of the coolant compared to the center of the coolant flowing portion.

12. The semiconductor module according to claim 11, wherein
the wiring pattern comprises:
a first wiring pattern in which the first direction is defined as the longitudinal direction; and
a second wiring pattern in which a second direction perpendicular to the first direction in the plane is defined as the longitudinal direction; wherein
in a top view, the entire of the first wiring pattern and the second wiring pattern is arranged to overlap with the cooling fin.

13. The semiconductor module according to claim 12, wherein
the cooling fin extends along the first direction and is provided side-by-side in the second direction.

14. The semiconductor module according to claim 11, wherein
the semiconductor device according to claim 1 is provided on the circuit board, is electrically connected to the wiring pattern, and further comprises an output terminal from which current flowing through the wiring pattern is outputted; and
the output terminal is arranged on the downstream side of the flowing path of the coolant.

15. A vehicle comprising the semiconductor module according to claim 11.

* * * * *